US008267038B2

(12) United States Patent
Kojima

(10) Patent No.: US 8,267,038 B2
(45) Date of Patent: Sep. 18, 2012

(54) METHOD FOR DISCHARGING DROPLETS AND DROPLET DISCHARGE APPARATUS

(75) Inventor: Kenji Kojima, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/286,629

(22) Filed: Nov. 1, 2011

(65) Prior Publication Data

US 2012/0042827 A1 Feb. 23, 2012

Related U.S. Application Data

(62) Division of application No. 12/141,287, filed on Jun. 18, 2008, now Pat. No. 8,071,158.

(30) Foreign Application Priority Data

Jul. 23, 2007 (JP) ................................. 2007-190436

(51) Int. Cl.
*B05C 5/00* (2006.01)
*C23C 16/52* (2006.01)

(52) U.S. Cl. ........................................... 118/313; 427/8

(58) Field of Classification Search ................... 118/313
See application file for complete search history.

(56) References Cited

U.S. PATENT DOCUMENTS

| | | | |
|---|---|---|---|
| 5,266,975 A | 11/1993 | Mochizuki et al. | |
| 2002/0140748 A1 | 10/2002 | Kanaya et al. | |
| 2005/0045096 A1 | 3/2005 | Kojima | |
| 2005/0093939 A1 | 5/2005 | Takagi | |
| 2006/0050106 A1 * | 3/2006 | Kojima | 347/37 |
| 2007/0229559 A1 * | 10/2007 | Oku | 347/9 |
| 2008/0024532 A1 | 1/2008 | Kim | |

FOREIGN PATENT DOCUMENTS

| | | |
|---|---|---|
| JP | 11-248925 A | 9/1999 |
| JP | 2004-209429 A | 7/2004 |
| JP | 2006-116437 A | 5/2006 |
| JP | 2007-111592 A | 5/2007 |
| JP | 2007-136450 A | 6/2007 |

* cited by examiner

*Primary Examiner* — Dah-Wei Yuan
*Assistant Examiner* — Charles Capozzi
(74) *Attorney, Agent, or Firm* — Global IP Counselors, LLP

(57) ABSTRACT

A droplet discharge apparatus is configured to move a droplet discharge head and a weight measurement unit relative to each other so that the droplet discharge head is placed in a position that faces the weight measurement unit by controlling a weight measurement unit movement part and a weight measurement unit secondary movement. The droplet discharge apparatus is also configured to control the droplet discharge head to perform a weight measurement discharge for measuring a weight of the liquid material discharged from the droplet discharge head during the feed/removal period, which includes a period for feeding and removing the substrate from the stage, and a period in which the stage is moved in relative fashion by the stage movement unit for performing feeding and removal operations.

15 Claims, 13 Drawing Sheets

METHOD FOR DISCHARGING DROPLETS AND DROPLET DISCHARGE APPARATUS

CROSS-REFERENCE TO RELATED APPLICATIONS

This application is a divisional application of U.S. patent application Ser. No. 12/141,287 filed on Jun. 18, 2008. The entire disclosure of U.S. patent application Ser. No. 12/141,287 is hereby incorporated herein by reference. This application claims priority to Japanese Patent Application No. 2007-190436 filed on Jul. 23, 2007. The entire disclosure of Japanese Patent Application No. 2007-190436 is hereby incorporated herein by reference.

BACKGROUND

1. Technical Field

The present invention relates to a method for discharging droplets using a droplet discharge head that discharges a liquid material as droplets, and to a droplet discharge apparatus provided with a droplet discharge head.

2. Related Art

A droplet discharge apparatus is conventionally known which has a droplet discharge head for discharging a liquid material as droplets, and which deposits the liquid material in an arbitrary position of a drawing target by discharging a droplet of a liquid material and depositing the droplet in an arbitrary position on the drawing target. Liquid material that contains a material of a functional film such as a color filter film of a color liquid crystal display can be coated with good precision in an arbitrary position and in any amount by using such a droplet discharge apparatus. The functional film can be formed to any thickness and in any shape by drying the coated liquid material.

The discharge amount per discharge of the liquid material discharged from the droplet discharge head varies depending on the viscosity of the liquid material and other characteristics. However, it is possible that fixed characteristics of the liquid material fed to the droplet discharge head will not necessarily be maintained depending on differences in production lots, changes with the lapse of time of the liquid material that is stored in a form that can be sent to the droplet discharge head, and other factors.

Japanese Laid-Open Patent Application No. 2004-209429 discloses a droplet discharge system, a method of measuring the discharge amount of a droplet discharge head, and a method of adjusting the discharge amount of a droplet discharge head. In the disclosure, the actual discharge weight is accurately measured and the discharge amount is adjusted so as to achieve an accurate value in correspondence with the measured value, whereby droplets can be accurately discharged.

SUMMARY

However, a discharge weight measurement step for accurately measuring the discharge weight must be carried out, and the drawing discharge step for discharging liquid material toward the drawing target must be suspended during the discharge weight measurement step. Therefore, there is a problem in that the time required for drawing by droplet discharge is extended.

The present invention was contrived in order to solve at least a portion of the problems droplet discharge apparatus, and the following modes or aspects can be implemented.

A droplet discharge apparatus according to one aspect include a droplet discharge head configured and arranged to discharge a liquid material, a stage configured and arranged to mount a substrate as a target of landing the discharged liquid material, a stage movement unit configured and arranged to move the droplet discharge head and the stage relative to each other in a main scanning direction, a weight measurement unit configured and arranged to measure the weight of the liquid material discharged from the droplet discharge head, a weight measurement unit movement part configured and arranged to move the droplet discharge head and the weight measurement unit relative to each other in the main scanning direction, a weight measurement unit secondary movement part configured and arranged to move the droplet discharge head and the weight measurement unit relative to each other in a secondary scanning direction that is substantially orthogonal to the main scanning direction, and a weight measurement controller configured to control the droplet discharge head, the weight measurement unit, the weight measurement unit movement part, and the weight measurement unit secondary movement part. The weight measurement controller is configured to move the droplet discharge head and the weight measurement unit relative to each other so that the droplet discharge head is placed in a position that faces the weight measurement unit by controlling the weight measurement unit movement part and the weight measurement unit secondary movement part. The weight measurement controller is configured to control the droplet discharge head to perform a weight measurement discharge for measuring a weight of the liquid material discharged from the droplet discharge head during the feed/removal period, which includes a period for feeding and removing the substrate from the stage, and a period in which the stage is moved in relative fashion by the stage movement unit for performing feeding and removal operations.

In accordance with this droplet discharge apparatus, a weight measurement discharge in which it is essential that the droplet discharge head perform a discharge is carried out during the feed/removal period in which the droplet discharge head is not required to perform a discharge. The weight measurement discharge is performed during the time the droplet discharge head is in a so-called resting state, whereby additional time is not required for the weight measurement discharge. Therefore, an increase in the operating time for drawing by droplet discharge can be reduced.

The feed/removal period has time for actually feeding and removing a substrate in which a treated substrate is actually dismounted and a substrate to be treated is subsequently actually mounted, time for positioning the moving a stage for mounting a substrate in order to perform feeding and removal operation, and additionally has time for positioning the mounted substrate, as well as other steps.

In the droplet discharge apparatus according to the aspect described above, it is preferred that the apparatus further comprise a dummy discharge receptacle configured and arranged to receive the liquid material discharged in a dummy discharge performed by the droplet discharge head in order to maintain a state of the droplet discharge head, a discharge test device having a test discharge landing sheet on which is caused to land the liquid material discharged in the test discharge performed by the droplet discharge head in order to test a discharge state of the droplet discharge head, the discharge test device further including a state observation device configured and arranged to acquire state information of the liquid material that has landed on the test discharge landing sheet, and a discharge test controller configured to control the droplet discharge head and the state observation device. The weight measurement unit movement part is configured and arranged to move the droplet discharge head, the discharge receptacle, and the test discharge landing sheet relative to each other in the main scanning direction. The weight measurement unit secondary movement part is configured and arranged to move the droplet discharge head, the discharge receptacle, and the test discharge landing sheet relative to each other in the secondary scanning direction. The weight measurement controller is configured to control the weight measurement unit movement part and the weight measurement unit secondary movement part, whereby the droplet discharge head, the discharge receptacle, and the test discharge landing sheet are moved relative to each other so that the droplet discharge head is placed in a position that faces the dummy discharge receptacle or the test discharge landing sheet. The controller is further configured to control the weight measurement unit movement part and the weight measurement unit secondary movement part, whereby the state observation device and the test discharge landing sheet are moved relative to each other so that the state observation device is placed in a position that faces the test discharge landing sheet. The discharge test controller is configured to control the droplet discharge head so as to perform the dummy discharge and the test discharge during the feed/removal period. The discharge test controller is also configured to control the state observation device so as to acquire the state information of the liquid material that has landed on the test discharge landing sheet faced by the state observation device.

In accordance with this droplet discharge apparatus, a test discharge in which it is essential that the droplet discharge head perform a discharge is carried out during the feed/removal period in which the droplet discharge head is not required to perform a discharge. The test discharge is performed during the time the droplet discharge head is in a so-called resting state, whereby additional time is not required for the test discharge. Therefore, an increase in the operating time for drawing by droplet discharge can be reduced. When the droplet discharge head is paused during the feed/removal period, it is possible that the discharge port may dry or otherwise malfunction. A dummy discharge is performed during the feed/removal period, whereby drying or the like of the discharge port can be reduced and an optimal state of the droplet discharge head can be maintained.

In the droplet discharge apparatus according to the aspect described above, it is preferred that the weight measurement controller is configured to control the droplet discharge head included in a set having a plurality of droplet discharge heads so as to perform the weight measurement discharge, and to control the rest of the droplet discharge heads in the set so that the dummy discharge is performed in the rest of the droplet discharge heads concurrent to the weight measurement discharge carried out by the droplet discharge head.

In accordance with this droplet discharge apparatus, while a single droplet discharge head in a set of droplet discharge heads performs a weight measurement discharge, the other droplet discharge heads perform a dummy discharge, whereby drying or the like of the discharge ports can be reduced and an optimal state of the droplet discharge heads can be maintained.

In the droplet discharge apparatus according to the aspect described above, it is preferred that the discharge test controller and the weight measurement controller are configured to control the state observation device and the droplet discharge head so that the acquisition of the state information by the state observation device and the discharge of the weight measurement discharge by the droplet discharge head are carried out at mutually offset timings.

When the weight measurement discharge is performed, the droplet discharge head and the weight measurement unit must be placed facing each other. When the state information is acquired, the state observation device and the test discharge landing sheet must be placed facing each other. When the droplet discharge head, the weight measurement unit, the state observation device, and the test discharge landing sheet are configured so that the weight measurement discharge and the acquisition of the state information can be simultaneously carried out, the positional relationship of the positions in which the devices are respectively disposed is limited. Therefore, there is a greater possibility that the droplet discharge apparatus will be large in size.

In accordance with this droplet discharge apparatus, the times at which the weight measurement discharge and the state information acquisition are performed are offset in relation to each other, whereby it is no longer unnecessary to dispose the devices so that the weight measurement discharge and the state information acquisition can be performed simultaneously. Therefore, the droplet discharge apparatus can be prevented from becoming larger in size because the degree of freedom in arranging the devices can be maintained.

It also becomes possible to integrally move the droplet discharge head, the weight measurement unit, the state observation device, and the test discharge landing sheet and a device for movement can be eliminated.

In the droplet discharge apparatus according to the aspect described above, it is preferred that the apparatus further comprise a test unit movement part configured and arranged to move the droplet discharge head or the state observation device, and the test discharge landing sheet relative to each other in the main scanning direction. The discharge test controller is configured to control the test unit movement part and the weight measurement unit secondary movement part, to move the droplet discharge head and the test discharge landing sheet relative to each other so that the droplet discharge head is placed in a position that faces the test discharge landing sheet, and to move the state observation device and the test discharge landing sheet relative to each other so that the state observation device is placed in a position that faces the test discharge landing sheet. The discharge test controller and the weight measurement controller are configured to control the state observation device and the droplet discharge head so that the acquisition of the state information by the state observation device and the discharge of the weight measurement discharge by the droplet discharge head are substantially concurrently performed.

In accordance with this droplet discharge apparatus, when the state observation device and the test discharge landing sheet are moved in a relative manner in the main scanning direction using test unit movement means and weight measurement unit movement means, the droplet discharge head and the weight measurement unit can be independently moved in a relative manner in the main scanning direction. In other words, the action of causing the droplet discharge head and the weight measurement unit to face each other and the action of causing the state observation device and the test discharge landing sheet to face each other can be carried out in a concurrent fashion. Accordingly, the weight measurement discharge and the state information acquisition can be performed independently, and one of the weight measurement discharge and the state information acquisition can be performed while the other is being formed. For this reason, the time required for performing a weight measurement discharge or the time required for acquiring state information can substantially eliminate an effect on the time required for drawing by droplet discharge and an increase in the time required for drawing by droplet discharge can be reduced.

In the droplet discharge apparatus according to the aspect described above, it is preferred that the apparatus further comprise a test unit secondary movement part configured and arranged to move the droplet discharge head or the state observation device, and the test discharge landing sheet relative to each other in the secondary scanning direction. The discharge test controller being configured to control the test unit movement part and the test unit secondary movement part to thereby move the droplet discharge head and the test discharge landing sheet relative to each other so that the droplet discharge head is placed in a position that faces the dummy discharge receptacle or the test discharge landing sheet, and to move the state observation device and the test discharge landing sheet relative to each other so that the state observation device is placed in a position that faces the test discharge landing sheet.

In accordance with this droplet discharge apparatus, the relative movement of the state observation device and the test discharge landing sheet in the secondary scanning direction and the relative movement of the droplet discharge head and the weight measurement unit in the secondary scanning direction can be independently carried out by using test unit secondary movement means and weight measurement unit secondary movement means. Weight measurement discharge and state information acquisition can thereby be more easily carried out in an independent manner in comparison with using only the weight measurement unit secondary movement means to carry out the relative movement of the state observation device and the test discharge landing sheet in the secondary scanning direction and the relative movement of the droplet discharge head and the weight measurement unit in the secondary scanning direction In the droplet discharge apparatus according to the aspect described above, it is preferred that a confirmation test is carried out in a case in which a difference, as determined with respect to a reference value, of a measured value in which the weight of the liquid material discharged for weight measurement from the droplet discharge head is measured by the weight measurement unit has exceeded a prescribed value.

In accordance with this droplet discharge apparatus, the measurement results of a weight measurement can be verified by a verification test. The measurement results are verified to thereby reduce the performance of unnecessary correction routines in response to temporary fluctuations caused by measuring temporarily generated fluctuations in the discharge amount.

In the droplet discharge apparatus according to the aspect described above, it is preferred that the confirmation test is the weight measurement carried out by the weight measurement unit.

In accordance with this droplet discharge apparatus, measurement results in the weight measurement can be verified by performing a weight measurement again because there is little possibility that temporarily generated fluctuations in the discharge amount will be measured in the weight measurement that is performed again.

In the droplet discharge apparatus according to the aspect described above, it is preferred that the confirmation test is the test of the discharge state of the droplet discharge head carried out by the discharge test device.

In accordance with this droplet discharge apparatus, a discharge test is carried out and the discharge state included discharge defects and the like are verified, whereby the existence of fluctuations in the discharge state that cause fluctuation in the discharge weight can be verified. Also, the type of fluctuations in the discharge state that cause fluctuations in the discharge weight can be verified. Examples of the types of fluctuations in the discharge state include discharge defects caused by discharge port clogging (no discharge), and excessive or insufficient discharge amounts.

In the droplet discharge apparatus according to the aspect described above, it is preferred that the apparatus further comprise a discharge condition setting unit configured to set discharge conditions of the droplet discharge head. The discharge condition setting unit being configured to correct the discharge conditions in the droplet discharge head when a difference in the measured value, in which the weight of the liquid material discharged for the weight measurement from the droplet discharge head is measured by the weight measurement unit, in relation to a reference value has exceeded a first value and is equal to or less than a second value.

In accordance with this droplet discharge apparatus, fluctuations in the discharge weight can be eliminated by merely correcting the discharge conditions using a discharge condition setting unit. Since the discharge conditions set by the discharge condition setting unit can be corrected in a short period of time, the time for responding to the fluctuations in the discharge weight can be shortened in comparison with the case in which other methods are used to eliminate fluctuations in the discharge weight. The first value is, e.g., the error allowance of the discharge weight and the second value is, e.g., the variable amount of the discharge weight that can be varied by the discharge conditions.

In the droplet discharge apparatus according to the aspect described above, it is preferred that one of the discharge conditions is a drive voltage applied to the droplet discharge head, and the correction includes correction of a drive voltage value or a drive voltage waveform.

In accordance with this droplet discharge apparatus, fluctuations in the discharge weight can be corrected by adjusting the drive voltage waveform or the drive voltage applied to the droplet discharge head. The droplet discharge head having a piezoelectric element as the drive source implements the setting value of the discharge amount by selecting a suitable drive voltage or drive voltage waveform. Therefore, fluctuations in the discharge weight can be corrected by adjusting the drive voltage or the drive voltage waveform.

In the droplet discharge apparatus according to the aspect described above, it is preferred that that the weight measurement discharge carried out by one of the droplet discharge heads is performed during a single cycle of the feed/removal period.

When the weight measurement discharge step is performed in a plurality of droplet discharge heads, the total time required in the weight measurement discharge step is increased. Therefore, the possibility increases that the total time will exceed the feed/removal period. The time that exceeds the feed/removal period causes the operating time for drawing to increase. In accordance with this droplet discharge apparatus, a single droplet discharge head performs the weight measurement discharge during a single cycle of the feed/removal period, and since the time required for the weight measurement discharge is the shortest time, the possibility can be reduced that the time required for the weight measurement discharge will cause an increase in the operating time for drawing.

In the droplet discharge apparatus according to the aspect described above, it is preferred that a head assembly containing a plurality of the droplet discharge heads is specified in advance, the weight measurement controller being configured to control the weight measurement unit movement part and the droplet discharge heads so that each of the droplet discharge heads included in the head assembly sequentially performs a single cycle of the weight measurement discharge and to weigh the liquid material discharged by the droplet discharge heads in conjunction with a plurality of cycles of the feed/removal being performed, the weight measurement controller being further configured to control the weight measurement unit movement part and the droplet discharge heads so that the feed/removal is performed a plurality of cycles without being accompanied by the concurrent discharge of the weight measurement, the feed/removal that accompanies the concurrent discharge of the weight measurement discharge of the first droplet discharge head, and the subsequent feed/removal that accompanies the concurrent discharge of the weight measurement discharge of the first droplet discharge head.

In accordance with this droplet discharge apparatus, feed/removal is carried out unaccompanied by the concurrent performance of a weight measurement discharge. In other words, the number of weight measurements in a fixed period of time in which the operation of discharging the liquid material toward a substrate is carried out can be reduced. The energy required for weight measurement can thereby be reduced. The weight measurement can sufficiently carry out a verification function when the weight measurement is carried out apart from a fixed operating time. For example, the verification function can be implemented using a method in which sets of a plurality of droplet discharge heads are formed, a single cycle of the weight measurement is carried out for each of the sets of droplet discharge heads, a prescribed operating time is allowed to elapse, and a single cycle of the weight measurement is carried out for each of the sets of droplet discharge heads.

In the droplet discharge apparatus according to the aspect described above, it is preferred that the apparatus further comprise a weight measurement receptacle configure and arranged to accommodate the liquid material discharged by the weight measurement discharge, and a receptacle management unit configured to calculate the period in which the weight measurement receptacle is to be replaced, and to issue replacement instruction information. The receptacle management unit being configured to calculate the replacement period depending on the discharge state of the weight measurement discharge.

In accordance with this droplet discharge apparatus, the receptacle controller calculates the replacement period of the weight measurement receptacle depending on the discharge state of the weight measurement discharge and issues replacement instruction information in accordance with the replacement period. The amount of liquid material that has landed and accumulated in the weight measurement receptacle can be ascertained depending on the state of execution of the weight measurement discharge. Therefore, the replacement of the weight measurement receptacle can be efficiently carried out depending on the information about the instructions to replace the receptacle management unit. Emptying the weight measurement receptacle at each cycle of the weight measurement discharge is inefficient in that replacement time is required at each cycle. Also, the use of a weight measurement receptacle having a capacity that does not require the weight measurement receptacle to be emptied results in a weight measurement receptacle, a weight measurement unit provided with the weight measurement receptacle, or the like that is larger than the case in which a weight measurement receptacle is used having a size that requires the weight measurement receptacle to be emptied, and results in a larger apparatus for discharging liquid material. Therefore, it is effective to set the size of the weight measurement receptacle to a size that requires occasional emptying.

In the droplet discharge apparatus according to the aspect described above, it is preferred that the receptacle controller is configured to count a total number of the weight measurement discharges, and to set the replacement period to a point in time at which the total number of discharges has exceeded a prescribed numerical value.

In accordance with this droplet discharge apparatus, the receptacle controller issues replacement instruction information that instructs the weight measurement receptacle to be replaced depending on the total number of discharges discharged for weight measurement discharge. The droplets of liquid material discharged for weight measurement discharge land in the weight measurement receptacle, except in the case of a defective discharge (no discharge). For this reason, the number of droplets of liquid material that has landed in the weight measurement receptacle is substantially equal to the number of discharges discharged in the for weight measurement discharge. Replacement of the weight measurement receptacle can be efficiently performed by instructing that the weight measurement receptacle be replaced depending on the total number of discharges discharged for weight measurement discharge. Since the solvent in the liquid material inside the weight measurement receptacle evaporates, the total number of discharges discharged for weight measurement discharge is preferably converted to the total weight of the solute contained in the liquid material for the number of discharges that have been discharged.

In the droplet discharge apparatus according to the aspect described above, it is preferred that that the receptacle controller is configured to calculate a total weight of the liquid material measured in the weight measurement, and to set the replacement period to a point in time at which the total weight has exceeded a prescribed numerical value.

In accordance with this droplet discharge apparatus, an instruction is issued to replace the weight measurement receptacle depending on the total of the weight measured by weight measurement discharge. The total weight measured in the weight measurement discharge is the weight of the liquid material accumulated in the weight measurement receptacle. Therefore, replacement of the weight measurement receptacle can be efficiently performed by instructing that the weight measurement receptacle be replaced depending on the total weight discharged in the weight measurement discharge. Since the solvent in the liquid material inside the weight measurement receptacle evaporates, the total weight that has been measured is preferably converted to the total weight of the solute contained in the liquid material.

BRIEF DESCRIPTION OF THE DRAWINGS

Referring now to the attached drawings which form a part of this original disclosure.

DETAILED DESCRIPTION OF EXEMPLARY EMBODIMENTS

Figure 1:
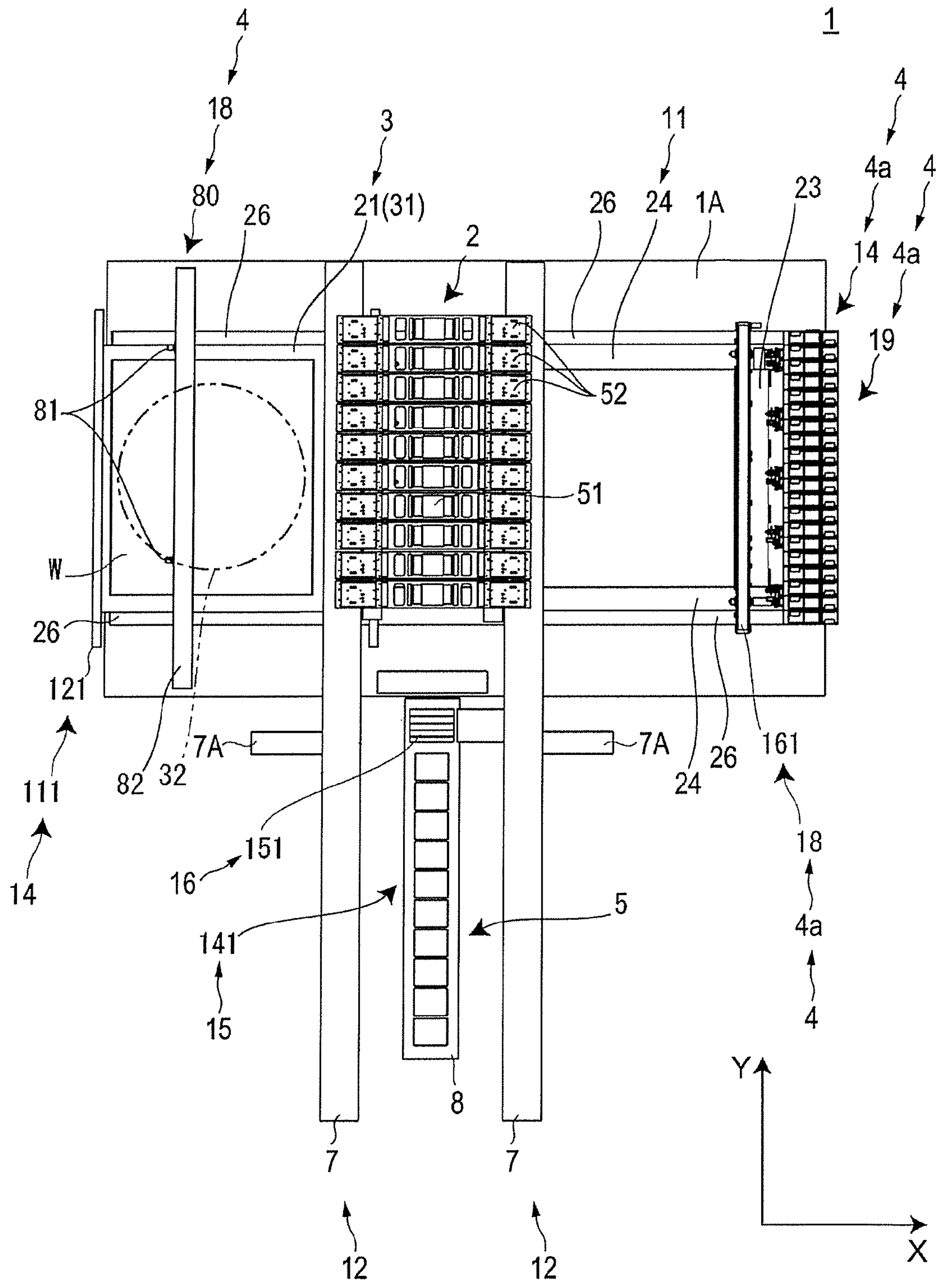
FIG. 1 is a plan view showing the schematic configuration of the droplet discharge apparatus.

Embodiments of the method of discharging droplets and the droplet discharging apparatus will be described below with reference to the drawings. The droplet discharge apparatus according to the present embodiment is, e.g., incorporated into a manufacturing line for flat panel displays, and is used to form a color filter of a liquid crystal display apparatus or a light-emitting element or the like of an organic EL apparatus, using a droplet discharge head that includes a pigment-containing functional liquid or a luminescent resin-containing functional liquid.

Method of Discharging Droplets

First, the method of discharging droplets used in the formation of a color filter or the like will be described. Examples of discharge techniques used in methods of discharging droplets include electrification control methods, pressure vibration methods, electromechanical conversion, electrothermal conversion, and electrostatic attraction. The electrification control method imparts an electric charge to a material using an electrification electrode and controls the direction of flight of the material using a deflecting electrode to discharge the material from a discharge nozzle. The pressure vibration method applies an ultrahigh pressure of 30 kg/cm$^2$ to a material to discharge the material to the distal end of a discharge nozzle. When a control voltage is not applied, the material proceeds in a rectilinear manner and is discharged from the discharge nozzle. When a control voltage is applied, an electrostatic repulsion is created within the material, and the material is dispersed and is not discharged from the discharge nozzle. The electromechanical conversion method makes use of a property whereby a piezo element (piezoelectric element) receives a pulsed electric signal and deforms. The piezo element deforms and thereby applies a pressure via a flexible substance to the space in which the material is stored. Material is pushed from this space and discharged from the discharge nozzle.

In the electrothermal conversion method, the material is rapidly vaporized to generate bubbles (foam) using a heater disposed inside the space in which the material is stored, and the material inside the space is discharged by the pressure of the bubbles. In the electrostatic attraction method, a small amount of pressure is applied inside the space in which the material is stored, a meniscus of the material is formed in the discharge nozzle, an electrostatic attraction is applied in this state, and the material is then drawn out. Additionally, it is possible to use a method in which changes in the viscosity of a fluid brought about by an electric field is used, a method that discharges droplets using an electrical discharge spark, as well as other techniques. Droplet discharge methods have an advantage in that a desired amount of the material can be accurately deposited in a desired position without wasteful use of the material. Among these methods, the piezo method does not apply heat to the liquid material. Therefore, there are advantages in that the composition or other aspects of the material are not affected, and size of the droplets can be easily adjusted by adjusting the drive voltage. In the present embodiment, the piezo method is used because the degree of freedom in selecting the liquid material is high and the controllability of the droplets is good.

Droplet Discharge Apparatus

Next, the entire configuration of the droplet discharge apparatus will be described with reference to FIG. 1. FIG. 1 is a plan view showing the schematic configuration of the droplet discharge apparatus.

A droplet discharge apparatus 1 is provided with a discharge unit 2 having a droplet discharge heads 17 (see FIG. 4), a work unit 3, a functional liquid supply unit (not shown), a test unit 4, a maintenance unit 5, and a discharge apparatus controller 6 (see FIG. 6), as shown in FIG. 1.

The discharge unit 2 has 120 droplet discharge heads 17 for discharging a functional liquid material as droplets. The work unit 3 has a workpiece stage 21 for mounting a workpiece W as the discharge target of the droplets discharged from the droplet discharge heads 17. The functional liquid supply unit has a reservoir tank (not shown) for storing the functional liquid, and the unit supplies functional liquid to the droplet discharge heads 17. The test unit 4 has a discharge test unit 18 and a weight measurement unit 19 for testing the state of discharge from the droplet discharge heads 17. A flushing unit 14 is provided to the weight measurement unit 19. The maintenance unit 5 has a suction unit 15 and a wiping unit 16 for maintaining the droplet discharge heads 17. The discharge apparatus controller 6 performs overall control of these mechanisms and the like. The weight measurement, drawing, discharge test, maintenance, and other processes described below are carried out based on control performed by the discharge apparatus controller 6. The discharge apparatus controller 6 corresponds to a weight measurement controller or a discharge test controller.

The droplet discharge apparatus 1 is provided with an X-axis support base 1A supported on a stone foundation. The units are disposed on the X-axis support base 1A. An X-axis table 11 extends in the X-axis direction, which is the main scanning direction, and is disposed on the X-axis support base 1A, and a workpiece stage 21 is moved in the X-axis direction (main scanning direction). An Y-axis table 12 is disposed on a pair of Y-axis support bases 7 that are bridged so as to straddle the X-axis table 11 via a plurality of supports 7A, and extends in the Y-axis direction, which is the secondary scanning direction. The discharge unit 2 is provided with ten carriage units 51, each having 12 droplet discharge heads 17.

The ten carriage units 51 are suspended from ten bridge plates 52, respectively. The bridge plates 52 are slidably supported by the Y-axis table 12 in the Y-axis direction via Y-axis sliders (not shown). The Y-axis table 12 moves the bridge plates 52 (carriage units 51) in the Y-axis direction (secondary scanning direction).

The droplet discharge heads 17 are driven and made to discharge liquid material in synchronization with the driving of the X-axis table 11 and Y-axis table 12, whereby functional droplets are discharged and an arbitrary drawing pattern is drawn on a workpiece W mounted on the workpiece stage 21.

Figure 2:
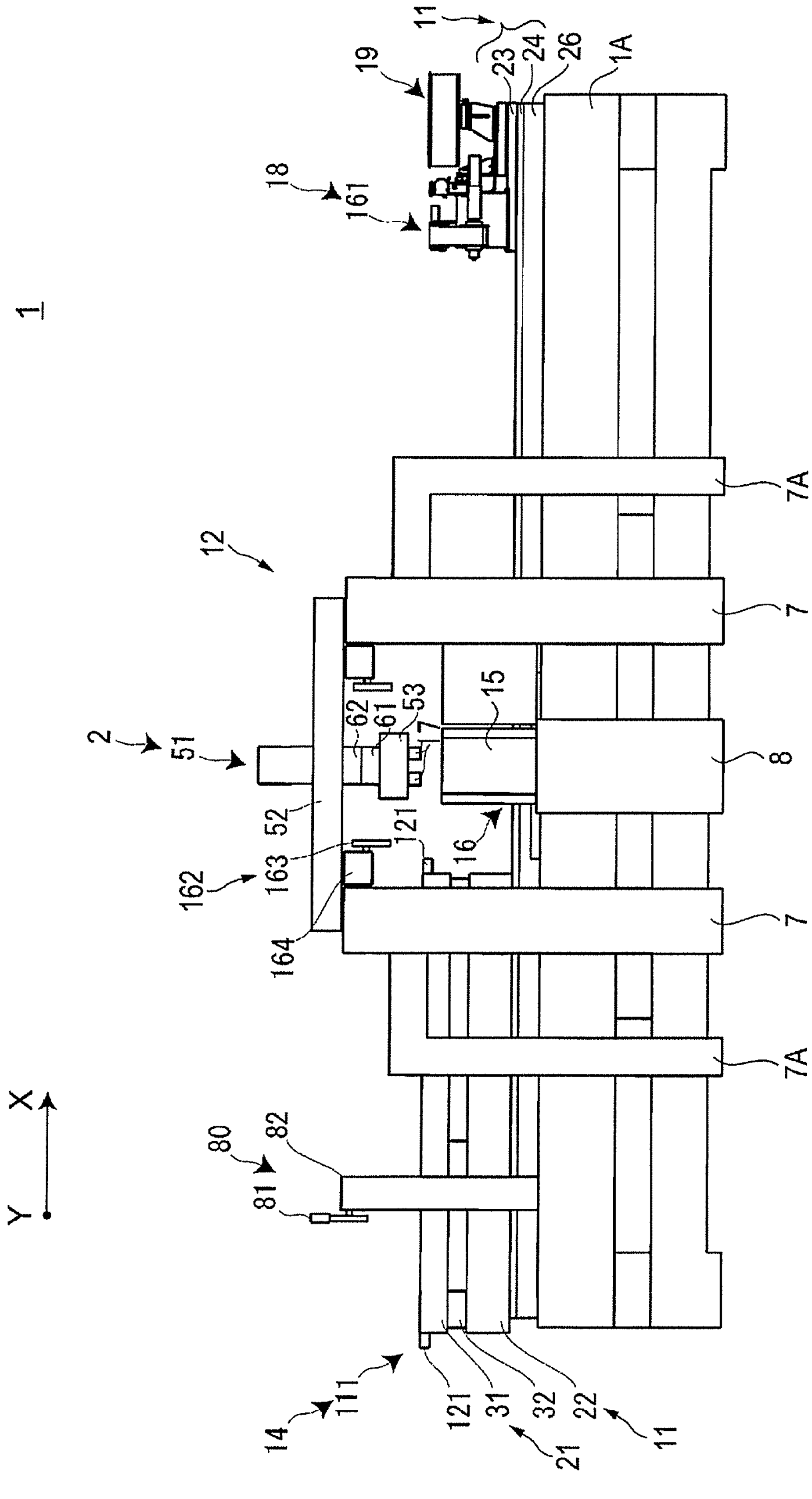
FIG. 2 is a side view showing the schematic configuration of the droplet discharge apparatus.

The discharge test unit 18 has a test drawing unit 161 and an imaging unit 162 (see FIG. 2). The test drawing unit 161 is configured so as to integrally move with the weight measurement unit 19 and the flushing unit 14. A block in which the test drawing unit 161, the weight measurement unit 19, and the flushing unit 14 are integrally disposed will be referred to as a discharge test block 4*a*. The imaging unit 162 has two test cameras 163, 163 (see FIG. 2), and a camera movement mechanism 164 (see FIG. 2) that slidably supports the test cameras 163 in the Y-axis direction. The camera movement mechanism 164 is secured to the Y-axis support bases 7. The two test cameras 163, 163 are moved independently in the Y-axis direction by camera movement motors (not shown is FIG. 2).

The suction unit 15 and the wiping unit 16 provided to the maintenance unit 5 are separated from the X-axis table 11 and are placed on a trestle 8 that is disposed in a position which allows the carriage units 51 to be moved by the Y-axis table 12. The suction unit 15 has a plurality of divided suction units 141, suctions the droplet discharge heads 17, and forcibly removes functional liquid from the discharge nozzles 78 (see FIG. 4) of the droplet discharge heads 17. The wiping unit 16 has a wiping sheet 151 on which a washing liquid has been sprayed, and is used for clearing (wiping) a nozzle formation surface 76*a* (see FIG. 4) of the droplet discharge heads 17 after suctioning. In this manner, the suction unit 15 and wiping unit 16 maintain the droplet discharge heads 17 and ensure functional maintenance or functional restoration of the droplet discharge heads 17.

Figure 3:
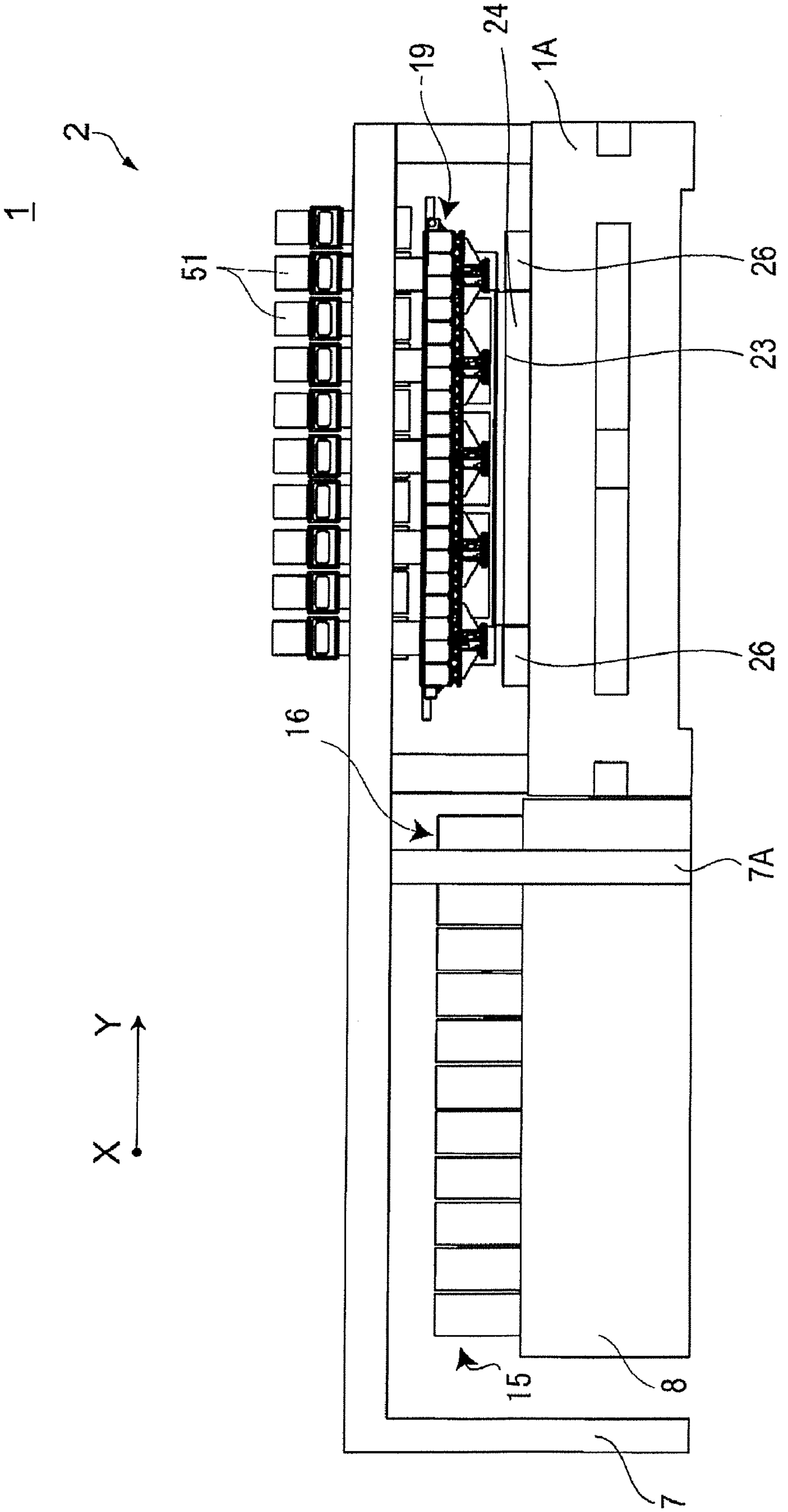
FIG. 3 is a side view showing the schematic configuration of the droplet discharge apparatus.

Next, the constituent elements of the droplet discharge apparatus 1 will be described with reference to FIG. 1 as well as FIGS. 2 and 3. FIGS. 2 and 3 are side views showing the schematic configuration of a droplet discharge apparatus. FIG. 2 is a side view of the side surface that extends in the X-axis direction, and FIG. 3 is a side view of the side surface that extends in the Y-axis direction.

The X-axis table 11 is provided with a first X-axis slider 22, a second X-axis slider 23, a left and right pair of X-axis linear motors 26, and a pair of X-axis shared support bases 24, as shown in FIG. 1, 2, or 3.

The workpiece stage 21 is mounted on the first X-axis slider 22. The first X-axis slider 22 is slidably supported in the X-axis direction by the X-axis shared support base 24 that extends in the X-axis direction. The discharge test block 4*a* formed integrally with the test drawing unit 161, the weight measurement unit 19, and the flushing unit 14 is mounted on the second X-axis slider 23. The second X-axis slider 23 is slidably supported in the X-axis direction by the X-axis shared support base 24 that extends in the X-axis direction. The X-axis linear motors 26 are provided in parallel to the X-axis shared support bases 24; and the first X-axis slider 22 or the second X-axis slider 23 is moved along the X-axis shared support base 24 to thereby move the workpiece stage 21 (workpiece W mounted on the workpiece stage 21) or the discharge test block 4*a* in the X-axis direction. The first X-axis slider 22 and the second X-axis slider 23 can be individually driven by the X-axis linear motors 26. The X-axis linear motor 26, the X-axis shared support base 24, and the first X-axis slider 22 correspond to stage movement means. The X-axis linear motor 26, the X-axis shared support base 24, and the second X-axis slider 23 correspond to weight measurement unit movement means. The X-axis direction corresponds to the main scanning direction, and the Y-axis direction corresponds to the secondary scanning direction.

The workpiece stage 21 has a chucking table 31 on which the workpiece W is chucked and set, a θ-table 32 for supporting the chucking table 31 and allowing the θ-position of the work W that is set on the chucking table 31 to be corrected in the θ-axis direction, as well as other components. The workpiece stage 21 in FIGS. 1 and 2 is placed in the feed/removal position for feeding and removing the workpiece W, and the chucking table 31 can be moved to this position when an untreated workpiece W is introduced (fed) to the chucking table 31 or when a treated workpiece W is recovered (removed). In the feed/removal position, the workpiece W is loaded and unloaded (mounted and dismounted) from the chucking table 31 by using a robot arm (not shown). A mechanism (not shown) for pre-aligning the workpiece W is incorporated into the chucking table 31 so that the workpiece thus fed is aligned in the X- and Y-axis directions. The alignment of an untreated workpiece W thus fed to the chucking table 31 is performed in the feed/removal position by using the θ-table 32. A pair of the pre-drawing flushing boxes 121 of a pre-drawing flushing unit 111 is attached to a pair of sides parallel to the Y-axis direction of the workpiece stage 21.

An image recognition unit 80 has two alignment cameras 81, 81 and a camera movement mechanism 82. The camera movement mechanism 82 is disposed so as to extend in the Y-axis direction on the X-axis support base 1A and to straddle the X-axis table 11. The alignment cameras 81 are slidably supported in the Y-axis direction by the camera movement mechanism 82 via a camera holder (not shown). The alignment cameras 81 supported by the camera movement mechanism 82 face the X-axis table 11 from above and can recognize images of reference marks (alignment marks; not shown) on the workpiece W mounted on the workpiece stage 21 on the X-axis table 11. The two alignment cameras 81, 81 are each independently moved in the Y-axis direction by camera movement motors (not shown).

The alignment cameras 81 are moved in the Y-axis direction by the camera movement mechanism 82 in cooperation with the movement of the workpiece stage 21 in the X-axis direction while the alignment marks of various workpieces W fed by the robot arm described above are imaged and the positions of the workpieces W are recognized. The θ-correction of the workpieces W is carried out by the θ-table 32 on the basis of imaging results of the alignment cameras 81.

The Y-axis table 12 is provided with ten sets of Y-axis sliders (not shown) and a pair of Y-axis linear motors (not shown). The pair of Y-axis linear motors is disposed on the above-described pair of Y-axis support bases 7, 7 and extends in the Y-axis direction. Also, 20 (ten sets) of Y-axis sliders are slidably supported by ten units each of the pair of Y-axis support bases 7, 7, respectively. A set of Y-axis sliders, composed of a single Y-axis slider supported by each of the pair of Y-axis support bases 7, 7, dually supports the bridge plates 52 on which the carriage units 51 in the discharge unit 2 are secured. Also, ten bridge plates 52 secured to ten carriage units 51 in the discharge unit 2 are disposed on the pair of Y-axis support bases 7, 7 via 10 sets of Y-axis sliders that dually support the ten bridge plates 52.

When the pair of Y-axis linear motors are driven (in synchronization), the Y-axis sliders guide the pair of Y-axis support bases 7, 7 and move parallel to the Y-axis direction at the same time. The bridge plates 52 thereby moves in the Y-axis direction, and the carriage units 51 suspended from the bridge plates 52 move in the Y-axis direction. In this case, controlling the driving of the Y-axis linear motors allows the carriage units 51 to be individually moved independently from each other, or to be moved as a single entity.

Figure 5:
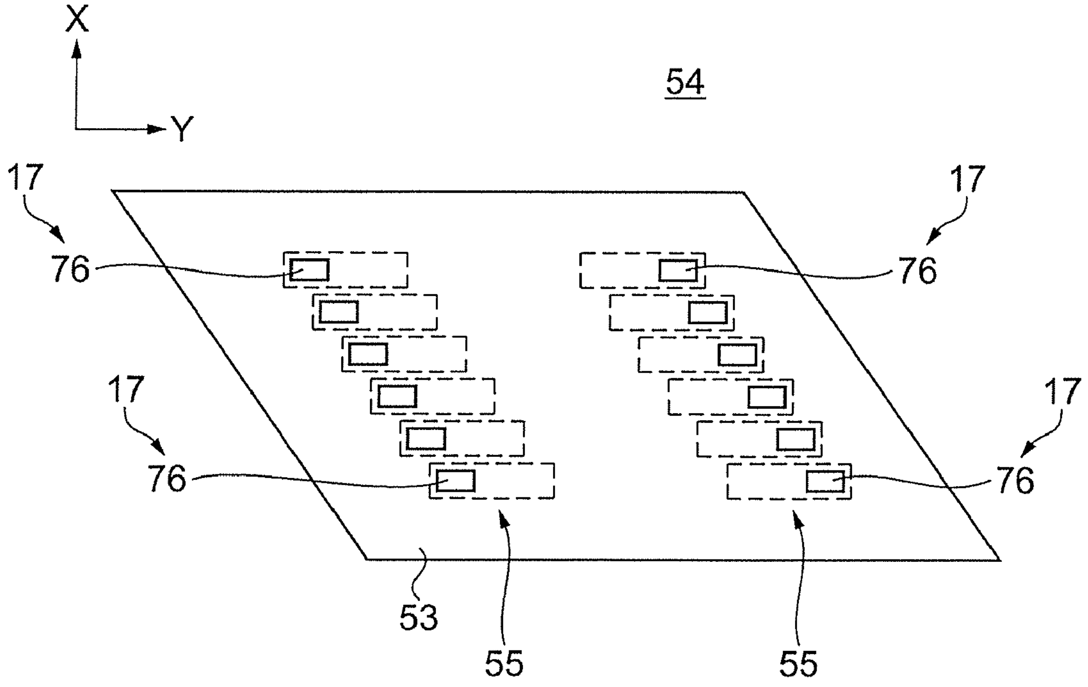
FIG. 5 is a plan view showing the schematic configuration of a head unit.

The carriage units 51 are provided with head units 54 that each have 12 droplet discharge heads 17, and a sub-carriage 53 that divides and supports the 12 droplet discharge heads 17 in two groups of six (see FIG. 5). The carriage units 51 are provided with a θ-rotation mechanism 61 for supporting the head units 54 in a manner that allows θ-correction (θ-rotation), and a suspended member 62 for supporting the head units 54 on the bridge plates 52 via the θ-rotation mechanism 61.

Configuration of the Droplet Discharge Head

Figure 4:
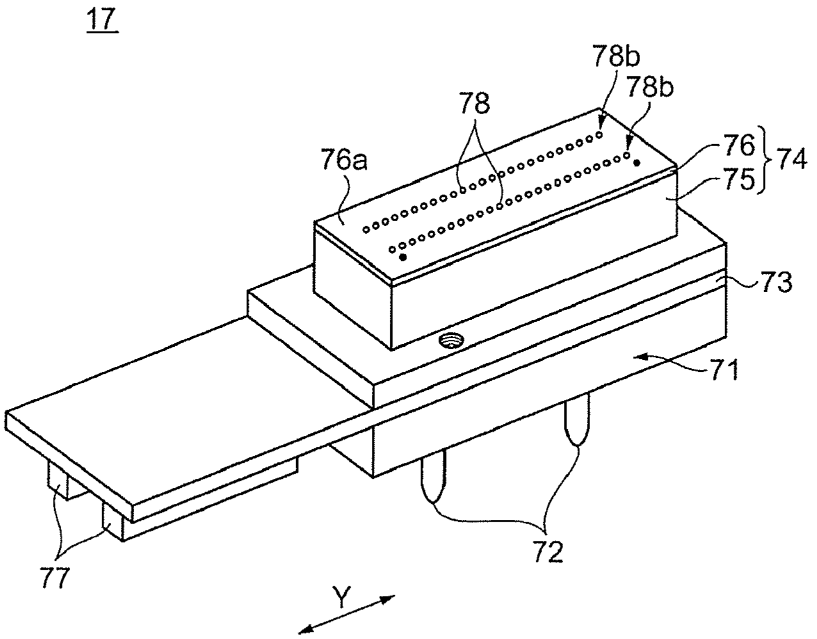
FIG. 4 is an external perspective view showing a general overview of the droplet discharge head.

Next, the droplet discharge heads 17 will be described with reference to FIG. 4. FIG. 4 is an external perspective view showing a general overview of a droplet discharge head.

The droplet discharge heads 17 are a so-called twin needle units provided with a liquid introduction part 71 having twin connection needles 72, 72, a rectangular head main unit 74 that connects to the liquid introduction part 71, and a head substrate 73 that laterally protrudes from between the liquid introduction part 71 and the head main unit 74, as shown in FIG. 4. The head main unit 74 has a pump unit 75 connected to the liquid introduction part 71, and a nozzle formation plate 76 connected to the pump unit 75. A discharge nozzle 78 that opens to the nozzle formation surface 76*a* is formed in the nozzle formation plate 76. Two nozzle rows 78*b* composed of 180 discharge nozzles 78 per row are formed in the droplet discharge heads 17. A piezoelectric element is provided to the pump unit 75, and functional liquid supplied from the liquid introduction part 71 is discharged from the discharge nozzle 78 by driving the piezoelectric element. A single piezoelectric element is provided in correspondence with a single discharge nozzle 78, and functional liquid can be independently discharged for each discharge nozzle 78. A pair of connectors 77, 77 is provided to the head substrate 73. The connector 77 is connected to a relay substrate, which is itself connected to the discharge apparatus controller 6, by an FFC cable or the like, whereby the droplet discharge heads 17 are connected to the discharge apparatus controller 6.

The nozzle row 78*b* extends in the Y-axis direction in a state in which the droplet discharge heads 17 are mounted on the droplet discharge apparatus 1. The discharge nozzles 78 in the two nozzle rows 78*b* are offset in position from each other by a half-nozzle pitch in the Y-axis direction. In the same position in the X-axis direction, the droplets discharged from the discharge nozzles 78 in the nozzle rows 78*b* are designed to land in a straight line at equidistant intervals in alignment with the Y-axis direction.

Head Units

Next, the head units 54 will be described with reference to FIG. 5. FIG. 5 is a plan view showing the schematic configuration of one of the head units. The X and Y axes shown in FIG. 5 match the X and Y axes shown in FIG. 1 in a state in which the head unit 54 is mounted on the droplet discharge apparatus 1. The head unit 54 has a sub-carriage 53, as well as 12 droplet discharge heads 17 mounted on the sub-carriage 53, as shown in FIG. 5. The droplet discharge heads 17 are secured to the sub-carriage 53, and has a head main unit 74 loosely fitted in a hole (not shown in the drawing) formed in the sub-carriage 53, and a nozzle formation surface 76*a* that protrudes from the surface of the sub-carriage 53. FIG. 5 is a diagram as viewed from the nozzle formation surface 76*a*. The 12 droplet discharge heads 17 form two head groups 55 that are divided in the Y-axis direction and that each have six of the droplet discharge heads 17. The nozzle rows 78*b* of the droplet discharge heads 17 extend in the Y-axis direction.

The six droplet discharge heads 17 of each of the single head groups 55 are positioned so that mutually adjacent droplet discharge heads 17 in the Y-axis direction are positioned in a manner in which the discharge nozzle 78 at an end of one of the droplet discharge heads 17 is offset by a half-nozzle pitch in relation to the discharge nozzle 78 at an end of the other droplet discharge heads 17. The discharge nozzles 78 are aligned at equidistant intervals of a half-nozzle pitch in the Y-axis direction, assuming that the positions in the X-axis direction of all the discharge nozzles 78 are the same in the six droplet discharge heads 17 of each of the head groups 55. In other words, in the same positions in the X-axis direction, droplets discharged from the discharge nozzles 78 in the nozzle rows 78*b* of the droplet discharge heads 17 are designed to land in a straight line at equidistant intervals in alignment with the Y-axis direction. This straight line is referred to as a nozzle group line. Each of the he droplet discharge heads 17 is composed of one of the head groups 55 aligned in stepwise fashion in the X-axis direction so as to mutually overlap in the Y-axis direction.

The two head groups 55 of each of the head units 54 are separated from each other in the Y-axis direction by a distance equal to a single head group 55. In other words, when droplets are discharged one by one from each of the discharge nozzles 78 of a single head unit 54, and are made to land so as to have the same position in the X-axis direction, the discharge forms two nozzle group lines separated from each other by a distance equal to the length of a single nozzle group line. The head units 54 are the moved by a distance equal to the length of a single head group 55 in the Y-axis direction, and two more nozzle group lines are formed in the same manner, whereby a straight line composed of four nozzle group lines is formed. The straight line is designed so that the number of dots equal to 48 times the number of discharge nozzles 78 in the nozzle rows 78*b* is connected at an interval (nozzle pitch) equal to half the nozzle pitch of the discharge nozzles 78 in the nozzle rows 78*b*.

The adjacent head units 54 may also be positioned so that the head groups 55 are disposed at a distance from each other equal to the length of a single head group 55 in the Y-axis direction. Therefore, the discharge nozzles 78 of the discharge unit 2 are made to discharge functional liquid one droplet at a time on both sides of the movements made in the Y-axis direction by an amount corresponding to the length of the nozzle group line, whereby a straight line extending in the Y-axis direction can be formed. The length of a line that all of the 120 droplet discharge heads 17 of the discharge unit 2 can draw in two discharge cycles corresponds to the width of the workpiece W having a maximum size that can be mounted on the workpiece stage 21.

The droplet discharge heads 17 are disposed so that when some of the discharge nozzles 78 at the end of the nozzle rows 78*b* are not used, the unused discharge nozzles 78 overlap in the Y-axis direction with the discharge nozzles 78 that are to be used.

Electrical Configuration of the Droplet Discharge Apparatus

Next, the electrical configuration for driving the droplet discharge apparatus 1 will be described with reference to FIG.

Figure 6:
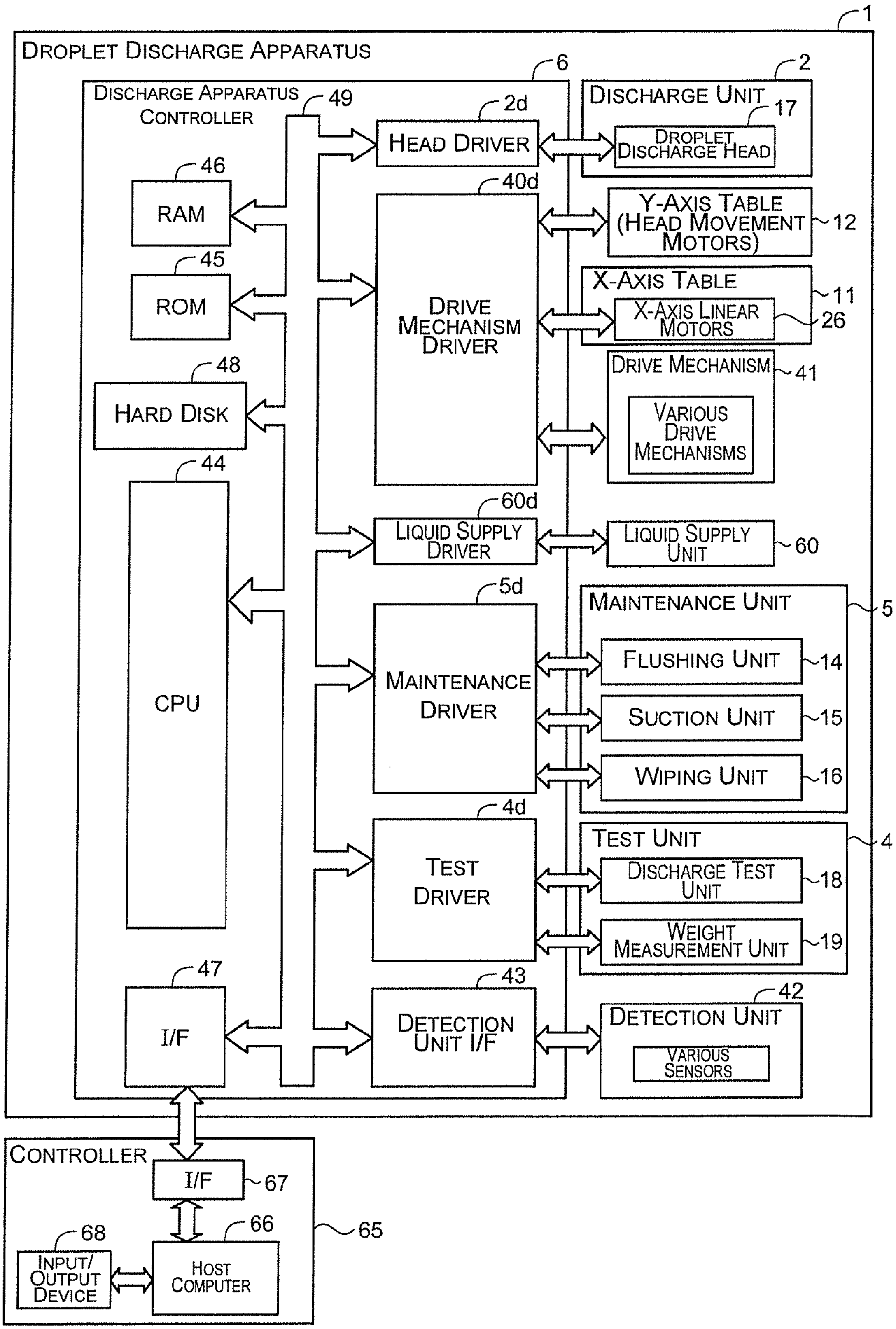
FIG. 6 is an electrical configuration block diagram showing the electrical configuration of a droplet discharge apparatus.

6. FIG. 6 is an electrical configuration block diagram showing the electrical configuration of a droplet discharge apparatus. The droplet discharge apparatus 1 is controlled by inputting data, operation start and stop commands, and other control commands via a controller 65. The controller 65 has a host computer 66 for performing computational processing, and an input/output device 68 for inputting and outputting information to be inputted to or outputted from the droplet discharge apparatus 1. The controller is connected to the discharge apparatus controller 6 via an interface (I/F) 67. An input/output device 68 is a keyboard that is capable of inputting information, an external input/output device for inputting and outputting information via a recording medium, a recording unit that stores information inputted via the external input/output device, a monitor, or the like.

The discharge apparatus controller 6 of the droplet discharge apparatus 1 has an interface (I/F) 47, a CPU (Central Processing Unit) 44, a ROM (Read Only Memory) 45, a RAM (Random Access Memory) 46, and a hard disk 48; and also has a head driver **2*d*, a drive mechanism driver 40*d*, a liquid supply driver 60*d*, a maintenance driver 5*d*, a test driver 4*d*, and an detection unit interface (I/F) 43. These components are electrically connected to each other via a data bus 49**.

The interface 47 receives data together with the controller 65, and the CPU 44 performs various computations on the basis of commands from the controller 65 and outputs control signals for controlling the operation of each component of the droplet discharge apparatus 1. The RAM 46 temporarily stores control commands and printing data received from the controller 65 in accordance with instructions from the CPU 44. The ROM 45 stores routines and the like that are used by the CPU 44 to perform various computations. The hard disk 48 stores control commands and printing data received from the controller 65, and stores routines and the like that are used by the CPU 44 to perform various computations.

The droplet discharge heads 17 in the discharge unit 2 are connected to the head driver **2*d*. The head driver 2*d* drives the droplet discharge heads 17 in accordance with a control signal from the CPU 44 and causes droplets of functional liquid to be discharged. Connected to the drive mechanism driver 40*d* are a head movement motor of the Y-axis table 12, the X-axis linear motors 26 of the X-axis table 11, and a drive mechanism 41 that includes various drive mechanisms having various drive sources. The drive mechanisms are the above-described camera movement motors for moving the alignment cameras 81, a drive motor of the θ-rotation mechanism 61, and the like. The drive mechanism driver 40*d* drives the above-described motors and the like in accordance with control signals from the CPU 44, moves the droplet discharge heads 17 and the workpiece W relative to each other to cause an arbitrary position of the workpiece W to face the droplet discharge heads 17, and operates in cooperation with the head driver 2*d*** to cause droplets of function liquid to land in an arbitrary position on the workpiece W.

The suction unit 15 of the maintenance unit 5, the wiping unit 16, and the flushing unit 14 are connected to the maintenance driver **5*d*. The maintenance driver 5*d* drives the suction unit 15, the wiping unit 16, or the flushing unit 14 in accordance with a control signal from the CPU 44 and performs maintenance work on the droplet discharge heads 17**.

The discharge test unit 18 of the test unit 4 and the weight measurement unit 19 are connected to the test driver **4*d*. The test driver 4*d* drives the discharge test unit 18 or the weight measurement unit 19 in accordance with a control signal from the CPU 44 and tests the discharge amount, ability to discharge, positional accuracy of landing, and other discharge conditions of the droplet discharge heads 17**.

A liquid supply unit 60 is connected to the liquid supply driver **60*d*. The liquid supply driver 60*d* drives the liquid supply unit 60 in accordance with a control signal from the CPU 44, and supplies functional liquid to the droplet discharge heads 17. A detection unit 42 containing various sensors is connected to the detection unit interface 43. Detection information detected by the sensors of the detection unit 42 is transmitted to the CPU 44 via the test unit interface 43**.

Discharge Test Unit

Figure 7:
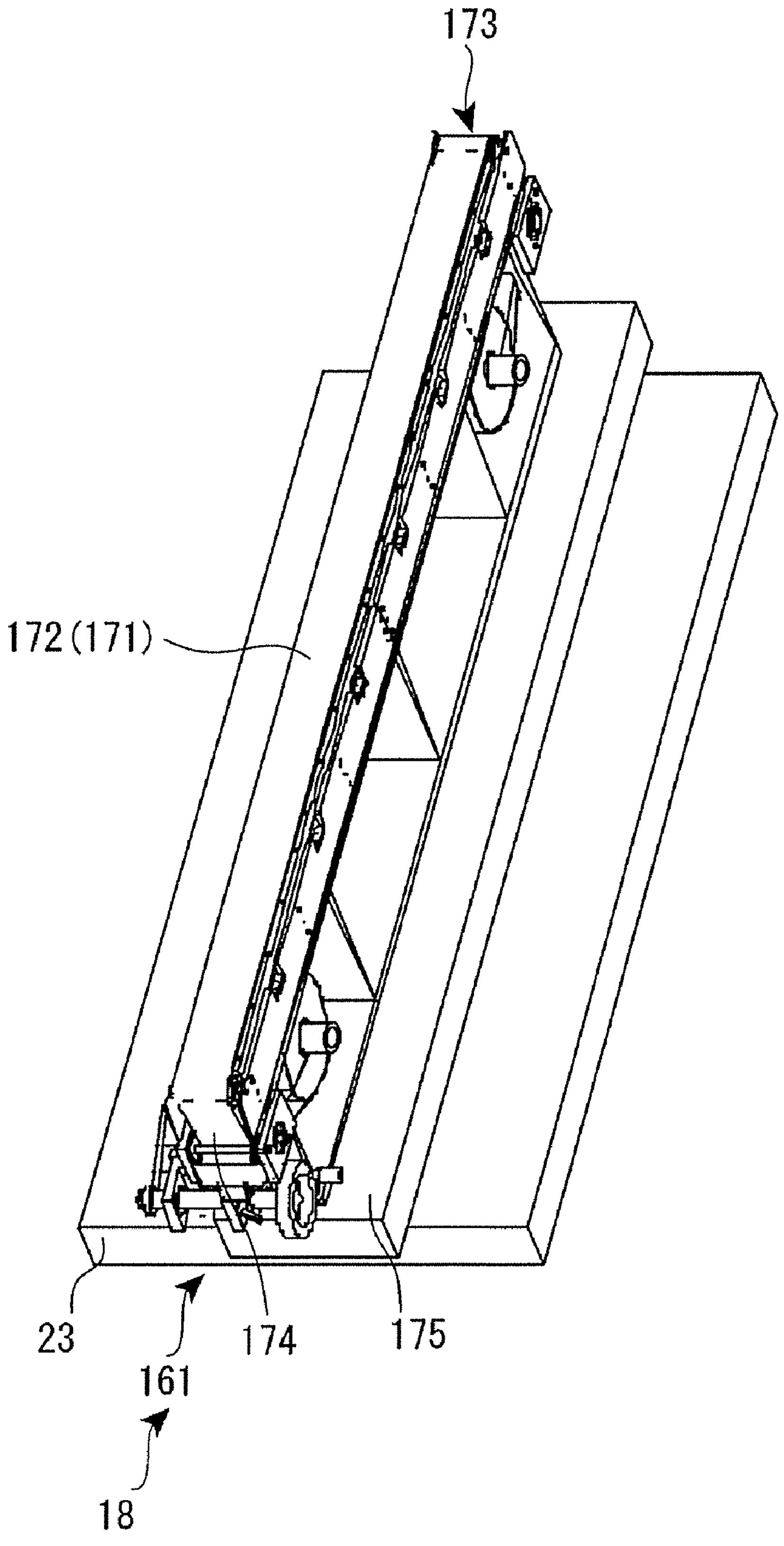
FIG. 7 is an external perspective view showing the overall configuration of the test drawing unit.

Next, the discharge test unit 18 will be described with reference to FIG. 7. The discharge test unit 18 has the test drawing unit 161 and the imaging unit 162, as previously described with reference to FIG. 1. The test drawing unit 161 is configured so as to integrally move with the weight measurement unit 19 and the flushing unit 14. FIG. 7 is an external perspective view showing the overall configuration of the test drawing unit.

The discharge test unit 18 tests whether functional liquid has been suitably discharged from (the discharge nozzles 78 of) all the droplet discharge heads 17 in the discharge unit 2. The test drawing unit 161 is configured so as to be capable of receiving the functional liquid discharged for testing from all of the discharge nozzles 78 of all of the droplet discharge heads 17 provided to all of the head units 54 in the discharge unit 2. The imaging unit 162 takes an image of and tests a test pattern (pattern of landed dots) drawn on the test drawing unit 161. As described above, the test drawing unit 161 is mounted on the X-axis table 11. The imaging unit 162 is secured to the Y-axis support base 7 and is securely disposed in a test position directly underneath the Y-axis table 12. The two test cameras 163, 163 can each move independently in the Y-axis direction.

The test drawing unit 161 is provided with a test sheet 171, a test stage 172, sheet feeding means 173, a sheet feeding support member 174, a unit base 175, and a vacuum sensor (not shown in the drawing), as shown in FIG. 7. The test sheet 171 is a striped sheet on which droplets of functional liquid discharged for testing from the droplet discharge heads 17 are caused to land. The test sheet extends in the Y-axis direction. The test stage 172 extends in the Y-axis direction, and the test sheet 171 is mounted on the test stage 172. The sheet feeding means 173 moves the test stage 171 so that an untested portion of the test sheet 171 is fed to the test stage 172 and that a tested portion is sent out from the test stage 172. The sheet feeding means 173 is supported by the sheet feeding support member 174, and the sheet feeding support member 174 is supported by the unit base 175. The vacuum sensor detects misalignment of the test sheet 171 mounted on the test stage 172.

The imaging unit 162 has the two test cameras 163, 163 as well as the camera movement mechanism 164 that slidably supports the test cameras 163 in the Y-axis direction, as described with reference to FIG. 2. The test cameras 163 take an image of and recognize landed dots discharged for testing onto the test sheet 171, and is therefore slidably supported in the Y-axis direction by the Y-axis support base 7 via the camera movement mechanism 164 secured to the Y-axis support base 7 in an orientation that faces the X-axis table 11 from above.

The test drawing unit 161 is configured so that when the chucking table 31 has moved to the feed/removal position, the test sheet 171 can move to the position facing the test cameras 163 of the imaging unit 162 and be positioned in the feed/removal position. In other words, the imaging unit 162 can take an image of the test pattern during remounting of the workpiece W and during alignment. The imaging result of the two test cameras 163 is sent to the discharge apparatus controller 6, the image is recognized, and it is determined based on the image recognition whether the discharge nozzles 78 of the droplet discharge heads 17 are discharging (whether the nozzles are clogged) a functional liquid in a normal manner. It is also determined whether the relative positions of the landed droplets are defined positions. These determinations are also made during alignment and workpiece remounting. The test sheet 171 corresponds to a test discharge landing sheet, the imaging unit 162 corresponds to a state observation device, and the discharge test unit 18 corresponds to a discharge test device.

Weight Measurement Unit

Figure 8:
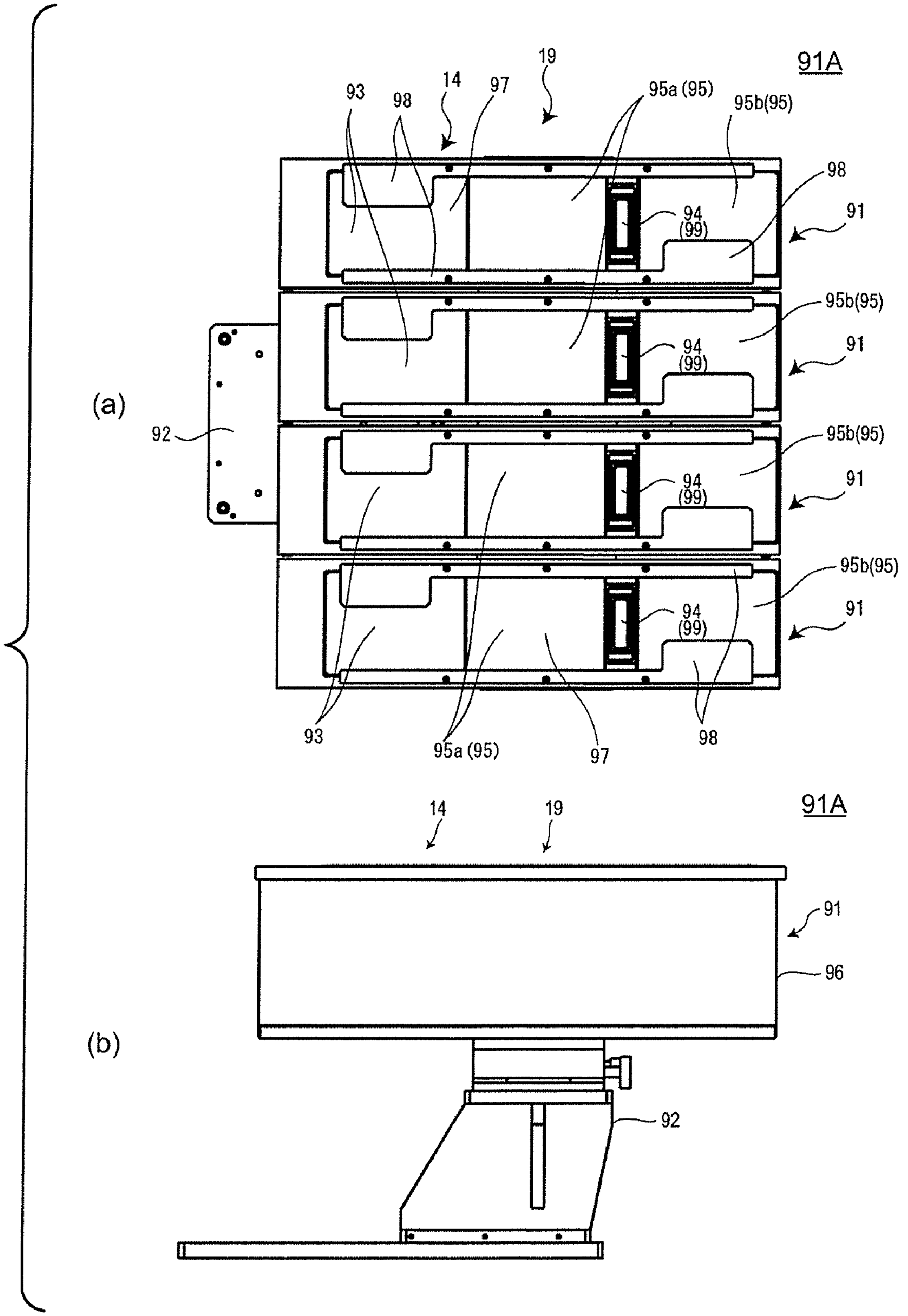
FIG. 8A is plan view of a weight measurement block including the weight measurement unit portion and the flushing unit portion.
FIG. 8B is a side view of the weight measurement block.

Next, the weight measurement unit 19 and the flushing unit 14 will be described with reference to FIG. 8. FIG. 8 is a view of the weight measurement block, which includes a weight measurement unit portion and a flushing unit portion. FIG. 8A is a plan view of the weight measurement block, and FIG. 8B is a side view of the weight measurement block. As described above, a discharge test block 4*a* in which the weight measurement unit 19, the flushing unit 14, and the test drawing unit 161 are made into a single entity is configured to move in an integral manner.

The weight measurement block 91A is provided with four weight measurement devices 91 and a support frame 92, as shown in FIG. 8. The support frame 92 supports the four weight measurement devices 91, the support frame 92 is secured to the second X-axis slider 23, and the weight measurement block 91A is mounted on the second X-axis slider 23. The discharge test block 4*a* has five weight measurement blocks 91A, and a total of 20 weight measurement devices 91 are mounted on the second X-axis slider 23 in alignment with the Y-axis direction. A single weight measurement device 91 corresponds to each of the single head groups 55, and two parallel weight measurement devices 91 correspond to a single head unit 54.

Each of the weight measurement devices 91 has a periodic flushing box 93, a liquid receptacle 94, an electron scale 99 (hidden below the liquid receptacles 94 in FIG. 8A), a weight measurement flushing box 95, a functional liquid absorption material 97, a pressing plate 98, and a casing 96 for accommodating these components. The periodic flushing boxes 93, the weight measurement flushing boxes 95, the functional liquid absorption materials 97, and the pressing plates 98 are contained in the flushing unit 14. The flushing unit 14 includes 20 the periodic flushing boxes 93 and the weight measurement flushing boxes 95 that are formed on 20 weight measurement devices 91. The liquid receptacles 94 and electron scales 99 are included in the weight measurement unit 19. The weight measurement unit 19 includes 20 each of the liquid receptacles 94 and the electron scales 99 that are formed in the 20 weight measurement devices 91 in the weight measurement unit 19.

Each of the liquid receptacles 94 faces only a single arbitrary droplet discharge head 17 among the six droplet discharge heads 17 in the head group 55, and has a size that allows functional liquid discharged from the droplet discharge heads 17 to be received. The liquid receptacles 94 are mounted on the electron scales 99, and the electron scales 99 measure the weight of the liquid receptacles 94 to thereby measure the weight of the functional liquid that has landed inside the liquid receptacles 94. The weight of the liquid receptacles 94 that has increased due to receiving the functional liquid discharged from the droplet discharge heads 17 is the weight of the functional liquid that was discharged from the droplet discharge heads 17 and landed inside the liquid receptacles 94.

The CPU 44 of the discharge apparatus controller 6 calculates the weight of the functional liquid thus measured, and stores the result in the RAM 46. Information containing instructions to replace the liquid receptacles 94 is issued when the accumulated weight reaches a fixed amount. The discharge apparatus controller 6 in this case corresponds to a receptacle management unit, and the liquid receptacles 94 corresponds to a weight measurement receptacles.

The weight measurement flushing boxes 95 are configured so that the weight measurement flushing boxes 95*a* and the weight measurement flushing boxes 95*b* are disposed on both sides of the liquid receptacles 94 in the X-axis direction. When a single droplet discharge head 17 among the six droplet discharge heads 17 in the head group 55 is in a position facing one of the liquid receptacles 94, the other five droplet discharge heads 17 in the head group 55 are positioned facing the corresponding weight measurement flushing boxes 95*a* or weight measurement flushing boxes 95*b*. When the droplet discharge head 17 being weighed faces one of the liquid receptacles 94 and performs a discharge for weight measurement, the droplet discharge heads 17 for which weight measurement will not carried out face the weight measurement flushing boxes 95*a* or weight measurement flushing boxes 95*b* and perform a dummy discharge.

Six droplet discharge heads 17 of the head group 55 carry out weight measurement using a single weight measurement device 91. Therefore, when a single droplet discharge head 17 performs a weight measurement discharge, the other five droplet discharge heads 17 wait for the weight measurement discharge to end, and the standby droplet discharge heads 17 can be made to perform a dummy discharge. For this reason, drying of the discharge nozzles 78 can be reduced in the standby state, the weight measurement discharge after the standby state can be carried out in a favorable manner, and a suitable measurement result can be obtained.

The periodic flushing boxes 93 receive the functional liquid discharged as a discard during periodic flushing.

The functional liquid absorption material 97 is spread out inside the weight measurement flushing boxes 95 and the periodic flushing boxes 93 in a state in which the two long sides of the functional liquid absorption material thereof are pressed by a pair of pressing plates 98. The liquid receptacles 94 are formed to a size that allows functional liquid to be received in nozzle row units in each of the droplet discharge heads 17.

The electron scales 99 measure the weight of the functional liquid discharged to the liquid receptacles 94, and output the measurement result to the discharge apparatus controller 6. The discharge apparatus controller 6 controls the drive power (voltage value) applied from the head driver 2*d* to the droplet discharge heads 17 on the basis of the measurement results inputted from the electron scales 99. In other words, when the weight measurement results are within a target range, drawing on the next workpiece W is performed without modifying the voltage value. On the other hand, when the weight measurement results are not within a target range, the voltage value is modified based on the resolution data of the weight measurement value and the applied voltage value calculated in advance, and weight measurement is performed again using the modified voltage value. The weight measurement and voltage value modification are repeated until the weight measurement results fall within a target range. The discharge apparatus controller 6 in this case corresponds to a discharge condition setting unit.

Configuration of the Flushing Boxes

Figure 9:
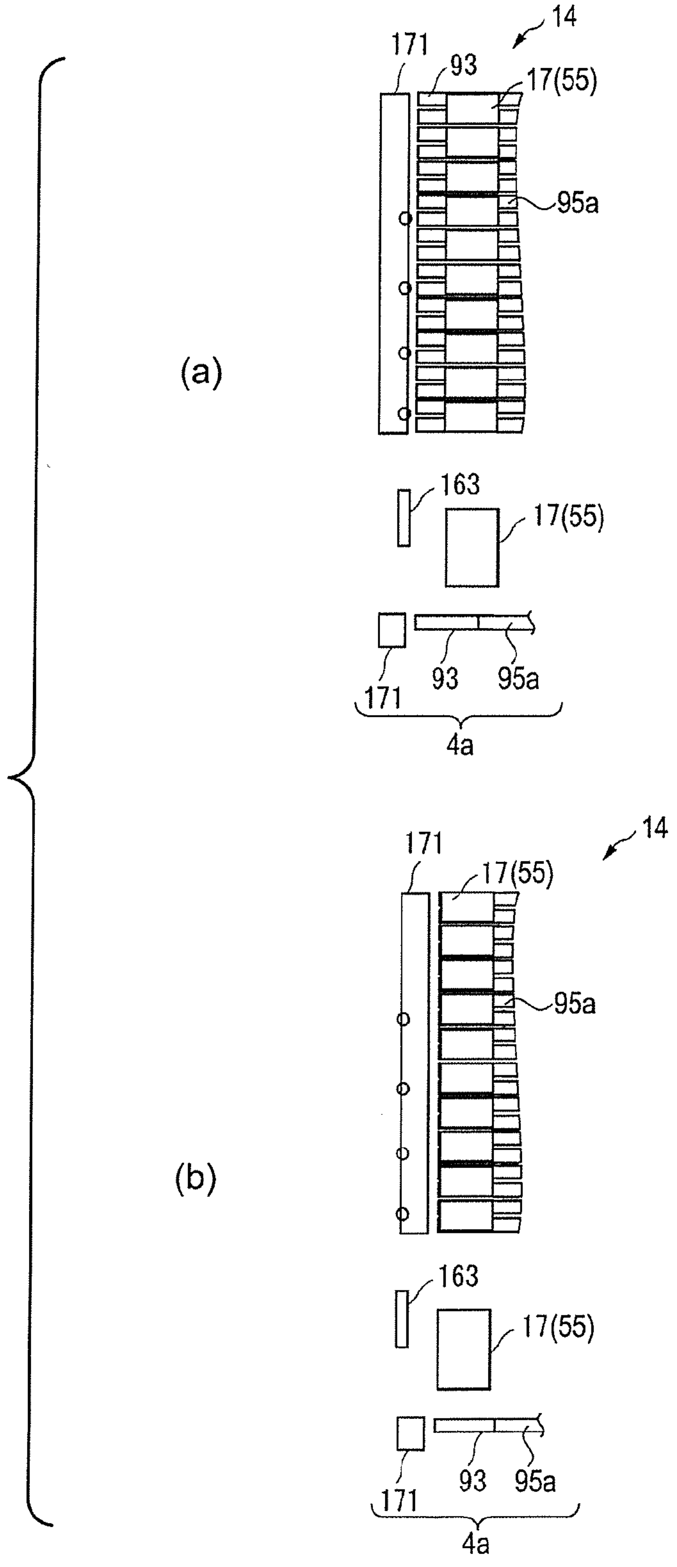
FIG. 9 is a schematic diagram showing the positional relationship between one of the test cameras, the droplet discharge heads, the weight measurement flushing boxes, and the periodic flushing boxes.

Next, the shape of the periodic flushing boxes 93 and the weight measurement flushing boxes 95, and the positional relationship between the test cameras 163 and droplet discharge heads 17 (head group 55) will be described with reference to FIG. 9. FIG. 9 is a schematic diagram showing the positional relationship between the test cameras, droplet discharge heads, weight measurement flushing boxes, and periodic flushing boxes.

Of the weight measurement flushing boxes 95 that are in two locations, the periodic flushing boxes 93 and the weight measurement flushing boxes 95*a* formed on the periodic flushing boxes 93 are used when the image of a droplet that has landed on the test sheet 171 is captured by the test cameras 163. These boxes are formed to a size that can simultaneously receive dummy discharges of the six droplet discharge heads 17 in the head groups 55 when the test cameras 163 face an arbitrary position in the X-axis direction of the test sheet 171. As described above, the weight measurement flushing boxes 95*a* and the periodic flushing boxes 93 are contained in the flushing unit 14, and the test sheet 171 is provided to the test drawing unit 161. The flushing unit 14 and the test drawing unit 161 constitute a discharge test block 4*a*, the mutual positional relationship is fixed, and these move in an integral fashion. Therefore, the weight measurement flushing boxes 95*a*, the periodic flushing boxes 93, and the test sheet 171 are moved in an integral fashion. The positional relationship between the test cameras 163 and the droplet discharge heads 17 (head groups 55) in the X-axis direction is also fixed.

The discharge test block 4*a* shown in FIG. 9A is positioned so that one of the test cameras 163 faces the endmost side of the periodic flushing boxes 93 in the X-axis direction of the test sheet 171. When the discharge test block 4*a* is in this position, the droplet discharge heads 17 of the head group 55 face the weight measurement flushing boxes 95*a* or the periodic flushing boxes 93, and the functional liquid discharged from the droplet discharge heads 17 lands in the weight measurement flushing boxes 95*a* or the periodic flushing boxes 93.

The discharge test block 4*a* shown in FIG. 9B is positioned so that one of the test cameras 163 faces the endmost side of the feed/removal position in the X-axis direction of the test sheet 171. When the discharge test block 4*a* is in this position, the droplet discharge heads 17 of the head group 55 face the periodic flushing boxes 93, and the functional liquid discharged from the droplet discharge heads 17 lands in the periodic flushing boxes 93.

Figure 10:
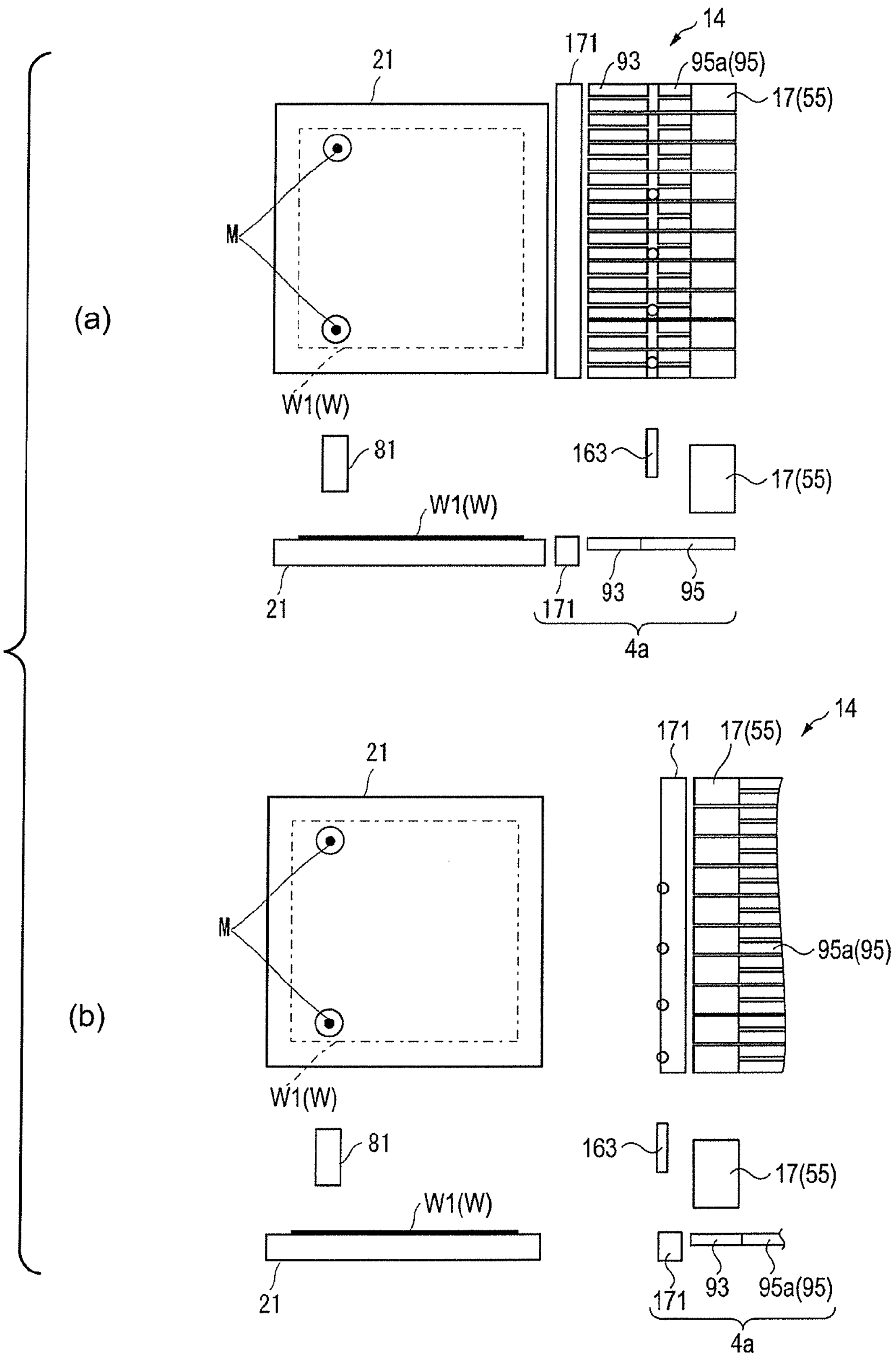
FIG. 10 is a schematic diagram showing the positional relationship between the alignment cameras, the workpiece stage, the periodic flushing boxes, the weight measurement flushing boxes, and the droplet discharge heads of the head group.

Described next is the positional relationship between the workpiece stage 21, the periodic flushing boxes 93, the weight measurement flushing boxes 95, and the droplet discharge heads 17 of the head group 55 when a workpiece W is being aligned. FIG. 10 is a schematic diagram showing the positional relationship between the alignment cameras, the workpiece stage, the periodic flushing boxes, the weight measurement flushing boxes, and the droplet discharge heads of the head group.

In FIG. 10A, a workpiece W1 in which an alignment mark M is farthest from the droplet discharge heads 17 is set in the center of the workpiece stage 21. The workpiece stage 21 is moved in the X-axis direction by the first X-axis slider 22 and is positioned so that the alignment mark M of the workpiece W1 faces the alignment cameras 81, and an image of the alignment mark M can be captured by the alignment cameras 81. The position of the workpiece stage 21 in this case is the closest to the head group 55 among the positions of the workpiece stage 21 in a state in which a workpiece W is being aligned. When the workpiece stage 21 is in this position, the farthest portion of the weight measurement flushing boxes 95 on the side far from the periodic flushing boxes 93 faces directly below the droplet discharge heads 17 of the head group 55 in a state in which the discharge test block 4*a* has been brought closest to the workpiece stage 21 by the second X-axis slider 23. In other words, one of the droplet discharge heads 17 is placed facing the liquid receptacles 94, weight measurement is performed, and a dummy discharge can be received by the weight measurement flushing boxes 95 from the other five droplet discharge heads 17 of the head group 55, even when the position of the workpiece stage 21, which limits the position of the discharge test block 4*a* in the X-axis direction, is on the side closest to the head group 55.

The movement of the discharge test block 4*a* to the feed/removal position is limited by the position of the workpiece stage 21, but since the movement to the opposite side of the feed/removal position is not limited, the discharge test block 4*a* can be positioned as shown in FIG. 10B. In the position shown in FIG. 10B, the droplet discharge heads 17 of the head group 55 face the periodic flushing boxes 93, and the functional liquid discharged from the droplet discharge heads 17 lands in the periodic flushing boxes 93.

The periodic flushing boxes 93 can thus receive the dummy discharge (flushing) from all six droplet discharge heads 17 of the head group 55 when the workpiece W is remounted or at other times when the drawing process is paused. Since the periodic flushing boxes 93 are disposed at a distance from the liquid receptacles 94, the possibility is very low that functional droplets discharged as dummies from the droplet discharge heads 17 will enter the liquid receptacles 94. The number of replacements of the liquid receptacles 94 can thereby be reduced.

Figure 11:
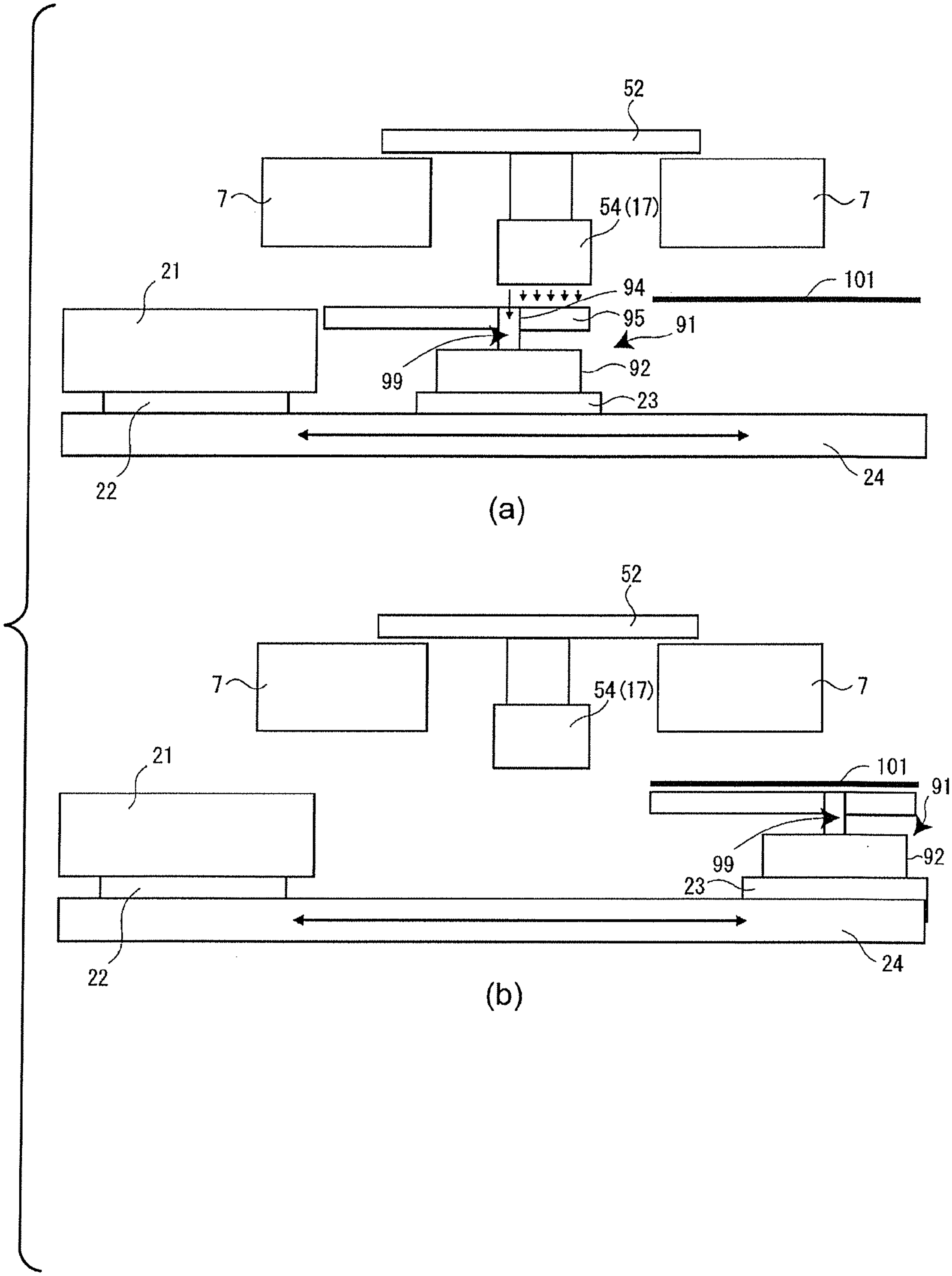
FIG. 11 is a side view showing the positional relationship between a head unit and a weight measurement device.
Figure 12:
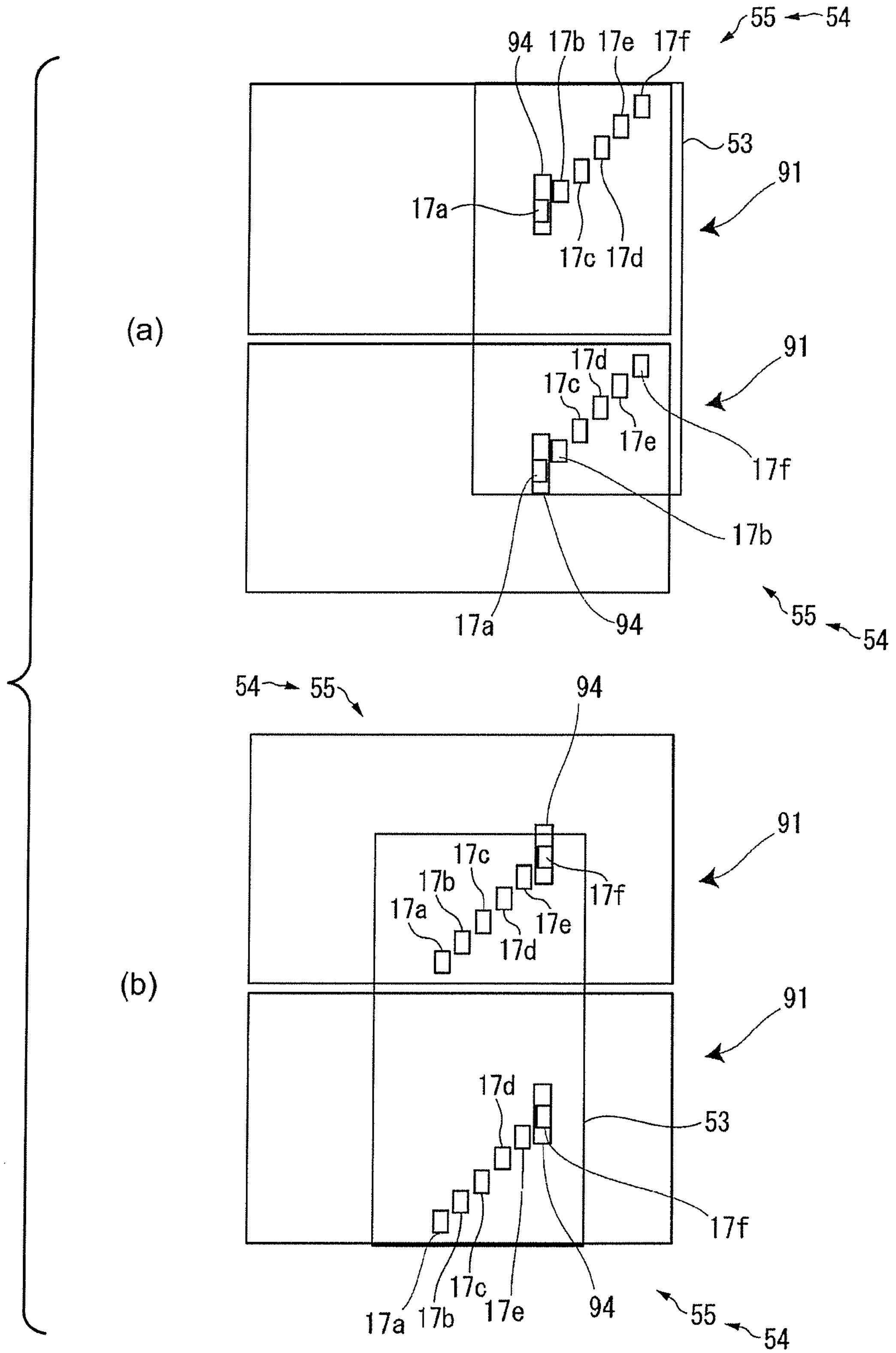
FIG. 12 is a plan view showing the positional relationship between the droplet discharge head and the weight measurement device.

Next, a series of operations for performing weight measurement will be described with reference to FIGS. 11 and 12. FIG. 11 is a side view showing the positional relationship between one of the head units and one of the weight measurement devices, and FIG. 12 is a plan view showing the positional relationship between the droplet discharge heads and the weight measurement devices.

The second X-axis slider 23 is moved in the X-axis direction by the X-axis linear motors 26 when weight measurement is started, and the ten head units 54 in the discharge unit 2 are moved in the Y-axis direction by the Y-axis linear motors, as shown in FIGS. 11A and 12A. This operation causes the liquid receptacles 94 of the weight measurement devices 91 secured to the second X-axis slider 23 to face first droplet discharge heads 17*a* of the head groups 55 of the head units 54.

Next, a weight measurement discharge is made from all of the nozzles of the first droplet discharge heads 17*a* of the head groups 55 toward the liquid receptacles 94. At this point, the second to sixth droplet discharge heads 17*b* to 17*f* of the head groups 55 face the weight measurement flushing boxes 95, and perform a dummy discharge toward the weight measurement flushing boxes 95.

When the weight measurement discharge of the droplet discharge heads 17*a* has ended, the weight measurement devices 91 are moved in the X-axis direction, and the liquid receptacles 94 are moved directly underneath a windshield member 101 disposed on the movement trajectory of the weight measurement devices 91, as shown in FIG. 11B. In this state, the weight of a discharge droplet that has landed in the liquid receptacles 94 is measured by the electron scales 99. The weight measurement devices 91 are disposed directly underneath the windshield member 101, whereby the electron scales 99 can accurately perform weight measurement without being affected by air flow because the air flow (e.g., down flow, turbulence, and the like in a chamber room) is cut off by the windshield member 101.

After the weight of the droplet discharged by the droplet discharge heads 17*a* has been measured, second droplet discharge heads 17*b* are placed facing the liquid receptacles 94 and a weight measurement discharge is carried out in the same manner. The weight of sequentially discharged droplets is subsequently measured in the same manner for the six droplet discharge heads 17 of the head groups 55. Lastly, sixth droplet discharge heads 17*f* are placed facing the liquid receptacles 94, as shown in FIG. 12B, a weight measurement discharge is performed, and the weight of the discharged droplets is measured.

Figure 13:
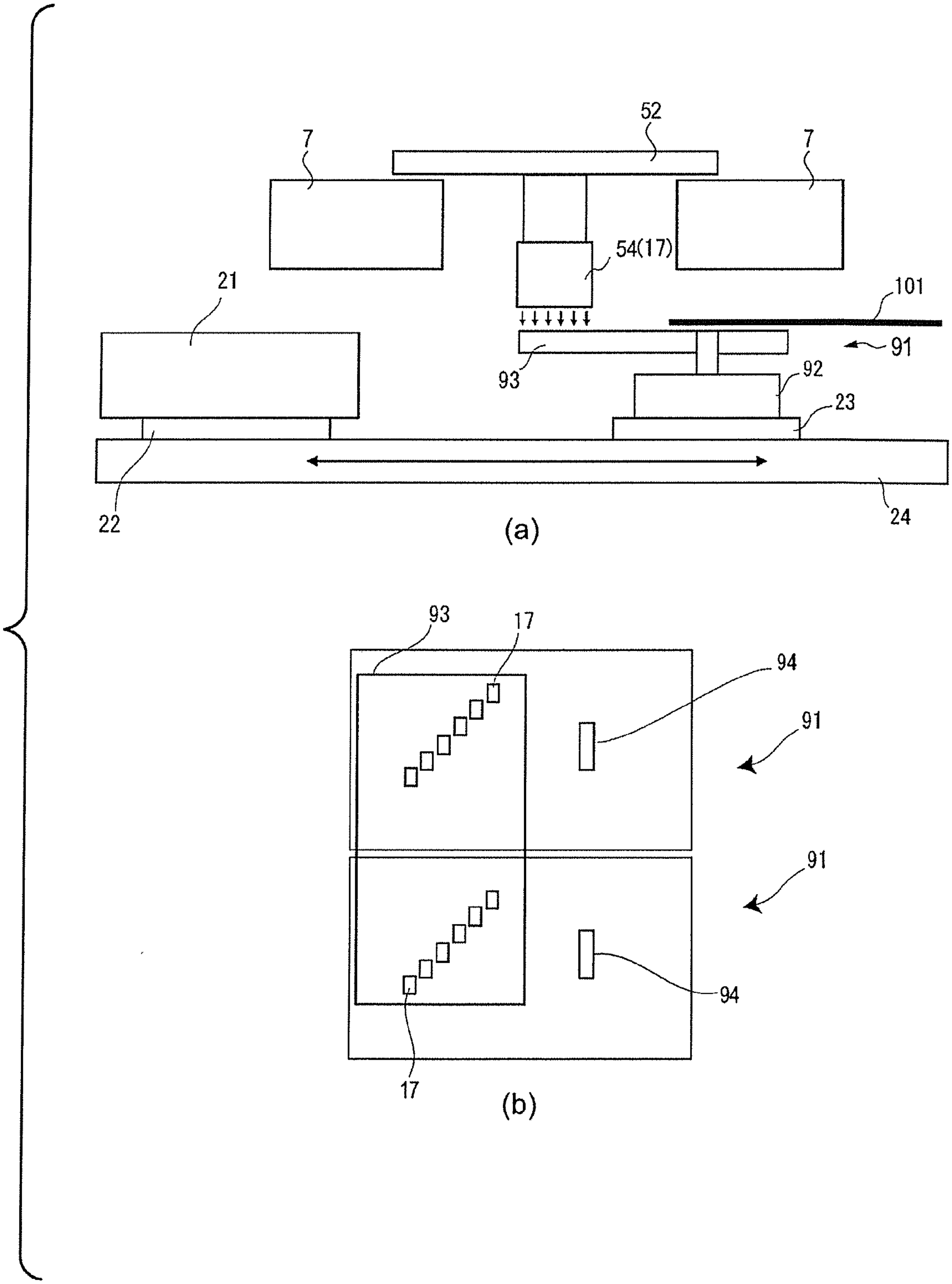
FIG. 13A is a side view showing the positional relationship between a head unit and a weight measurement device.
FIG. 13B is a plan view showing the positional relationship between the droplet discharge head and the weight measurement device.

Next, the operation of the droplet discharge heads 17 in the drawing process pause state will be described with reference to FIG. 13 for the case in which the workpiece stage 21 is in the feed/removal position and, the workpiece W is being fed to or removed from the workpiece stage 21. FIG. 13A is a side view showing the positional relationship between one of the head units and one of the weight measurement devices, and FIG. 13B is a plan view showing the positional relationship between the droplet discharge heads and the weight measurement devices. The periodic flushing boxes 93 of the weight measurement devices 91 secured to the second X-axis slider 23 are placed facing the six droplet discharge heads 17 of the head group 55 by using the X-axis linear motors 26 to move the second X-axis slider 23 in the X-axis direction during feeding of the workpiece W or at another time when the drawing process is paused. All of the droplet discharge heads 17 perform a dummy discharge toward the periodic flushing boxes 93.

Drawing

Figure 14:
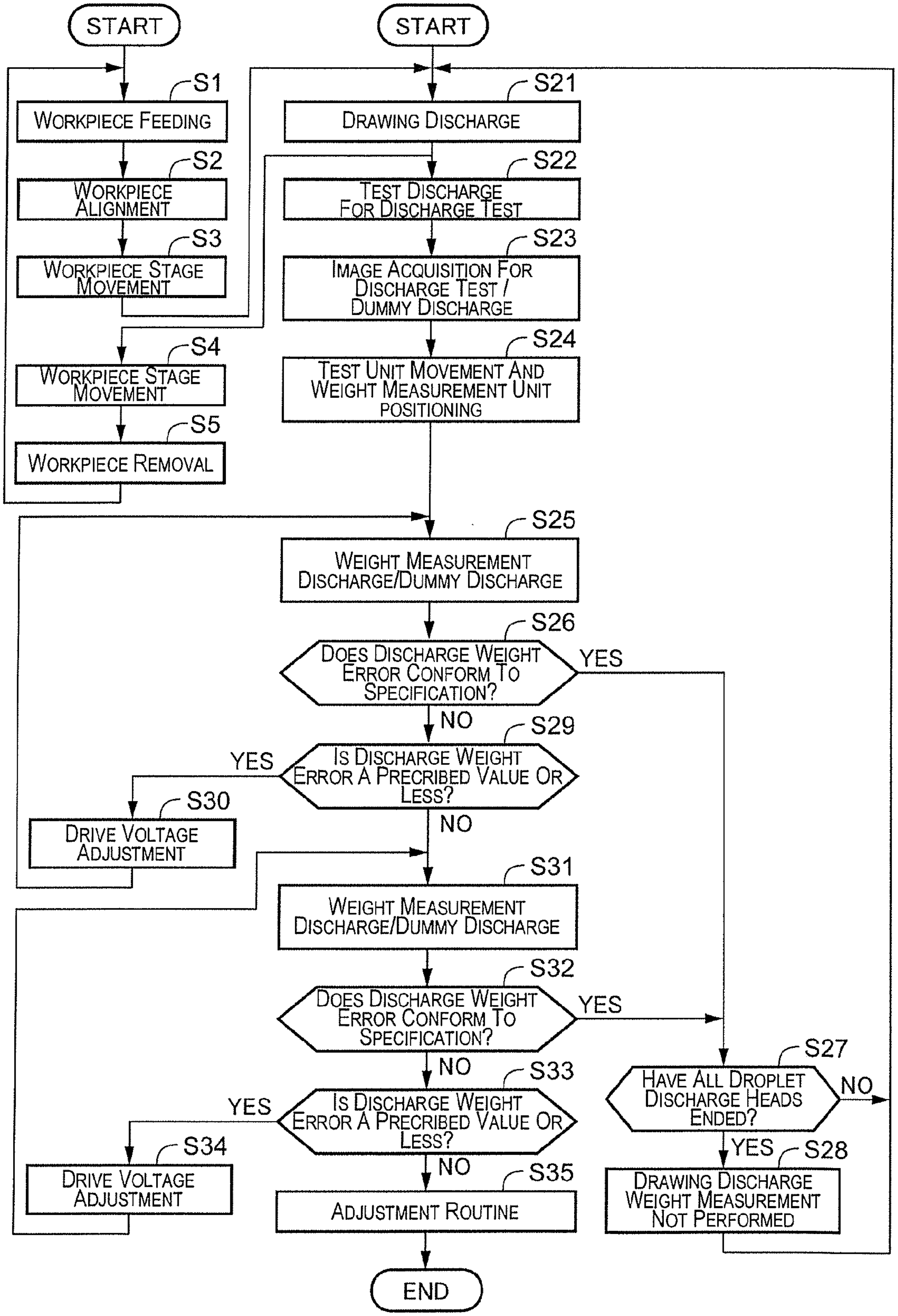
FIG. 14 is a flowchart showing the drawing step.

Next, the drawing step for placing a functional liquid in a prescribed position on a workpiece W by using the droplet discharge apparatus 1 will be described with reference to FIG. 14. FIG. 14 is a flowchart showing the drawing step.

Steps S1, S2, S3, S4, S5 of FIG. 14 are carried out by devices involved in the feeding and removal of the droplet discharge apparatus 1. Steps S21 to S34 are carried out by the discharge unit 2, the test unit 4, and the like. The devices of the droplet discharge apparatus 1 are configured so that the steps S1, S2, S3, S4, S5 and the steps S21 to S34 can be carried out in a concurrent fashion.

In step S1 of FIG. 14, a workpiece W is fed to the workpiece stage 21, which is in the feed/removal position of the droplet discharge apparatus 1. The workpiece W is fed by a feeder robot or the like.

Next, in step S2, the workpiece W mounted on the workpiece stage 21 is aligned. The workpiece W is aligned by a process in which the image of the alignment marks M formed on the workpiece W is captured by the alignment cameras 81 of the image recognition unit 80, and the θ-position of the workpiece W is corrected using the θ-table 32 on the basis of the imaging result.

Next, in step S3, the workpiece stage 21 moves in the X-axis direction. The X-axis linear motors 26 drive the first X-axis slider 22, whereby the workpiece stage 21 is moved to a start position in which the workpiece W aligned in the feed/removal position is to be subjected to the next drawing discharge step.

Step S21 is started on the workpiece W that has been moved to the start position. In step S21, a drawing discharge is performed from the droplet discharge heads 17 of the discharge unit 2 toward the workpiece W. More specifically, the droplet discharge heads 17 are placed facing an arbitrary position on the workpiece W depending on the movement of the workpiece W (workpiece stage 21) carried out by the X-axis table 11 (driving of the first X-axis slider 22 by the X-axis linear motors 26) and the movement of the droplet discharge heads 17 (head units 54 of the discharge unit 2) carried out by the Y-axis table 12. Additionally, the droplet discharge heads 17 are driven and caused to make a discharge, and functional droplets are discharged toward the workpiece W, whereby an arbitrary drawing pattern composed functional liquid is drawn on the workpiece W mounted on the workpiece stage 21.

Subsequent to step S21, the workpiece stage 21 is moved in the X-axis direction in step S4. The workpiece stage 21 is moved so as to be positioned in the feed/removal position by driving the first X-axis slider 22 using the X-axis linear motors 26. This movement is performed as an extension of the final relative movement of the drawing discharge without the first X-axis slider 22 (workpiece stage 21) stopping after the final relative movement of the drawing discharge.

Next, in step S5, the workpiece W on which a drawing pattern has been formed is removed from the workpiece stage 21. The workpiece W is removed by a feeder robot or the like.

Subsequent to step S5, the process advances to step S1 and, steps S1, S2, S3, S21, S4, and S5 are repeated. Steps S4, S5, S1, S2, S3 correspond to the feed/removal step. As described above, steps S4, S5, S1, S2, S3 are carried out using the X-axis linear motors 26, the image recognition unit 80, the θ-table 32, a feeder robot, or the like.

After step S21, a test discharge for testing the discharge is made from the droplet discharge heads 17 of the discharge unit 2 in step S22, which is started substantially at the same time as step S4. More specifically, the workpiece stage 21 is moved in the direction of the feed/removal position in step S4, whereby the discharge test block 4*a* can be moved to a position that faces the droplet discharge heads 17 of the discharge unit 2. The discharge test block 4*a* is secured to the second X-axis slider 23 and is moved in the X-axis direction by using the X-axis linear motors 26 to drive the second X-axis slider 23. The workpiece stage 21 is moved by using the X-axis linear motors 26 to drive the first X-axis slider 22. Accordingly, the discharge test block 4*a* and workpiece stage 21 can be moved independently. Therefore, the discharge test block 4*a* for performing a test discharge can be moved substantially concurrent to the final relative movement of the workpiece stage 21 for performing a drawing discharge. In the present embodiment, the movement of the discharge test block 4*a* for performing a test discharge is started substantially in synchronization with the final relative movement of the workpiece stage 21 for the drawing discharge. In other words, the movement of the discharge test block 4*a* for performing the test discharge of step S22 is started before the drawing discharge of step S21 is ended.

A test discharge is made from the droplet discharge heads 17 toward the test sheet 171 at the point at which the test sheet 171 of the test drawing unit 161 in the discharge test block 4*a* faces the droplet discharge heads 17 of the discharge unit 2. The discharge timing of the droplet discharge heads 17 is set so that droplets of functional liquid discharged from the droplet discharge heads 17 of the discharge unit 2 and landed on the test sheet 171 form a straight line extending in the Y-axis direction on the test sheet 171. The discharge test block 4*a* is moved so that the straight line formed by the droplets of functional liquid landed on the test sheet 171 is placed in a position that can be captured as an image by the test cameras 163 of the discharge test unit 18. The discharge made for testing from the droplet discharge heads 17 toward the test sheet 171 at the point at which the test sheet 171 faces the droplet discharge heads 17 of the discharge unit 2 corresponds to a test discharge step. Since the movement of the discharge test block 4*a* for carrying out a test discharge is started before the drawing discharge ends, the droplet discharge heads 17 perform a test discharge substantially in continuity with a drawing discharge. Therefore, the same discharge as the drawing discharge is reproduced with the test discharge because there is substantially no change in the state of the droplet discharge heads 17 between the drawing discharge and the test discharge.

Next, in step S23, an image of a droplet of functional liquid that has landed on the test sheet 171 is captured by the test cameras 163. An image is captured for each droplet, and information of the size and the landing position of the droplets is obtained from the image. The droplet discharge heads 17 perform a dummy discharge for maintaining a constant state for the functional liquid inside the droplet discharge heads 17 in parallel with the image acquisition carried out by the test cameras 163. The droplet discharge heads 17 of the discharge unit 2 face the weight measurement flushing boxes 95*a* or the periodic flushing boxes 93 in a state in which the test cameras 163 are placed in a position that faces the test sheet 171, as described with reference to FIG. 9. Accordingly, the functional liquid discharged from the droplet discharge heads 17 lands in the weight measurement flushing boxes 95*a* or the periodic flushing boxes 93.

Next, in step S24, the test unit 4 is moved and the weight measurement unit 19 (test unit 4) is positioned so that the weight measurement unit 19 faces the droplet discharge heads 17. More specifically, the X-axis linear motors 26 are used to move the second X-axis slider 23 in the X-axis direction, as described with reference to FIGS. 11 and 12. Additionally, the Y-axis linear motors and the Y-axis sliders are used to move the ten head units 54 in the discharge unit 2 in the Y-axis direction along the Y-axis table 12. The liquid receptacles 94 of the weight measurement devices 91 secured to the second X-axis slider 23 are thereby placed facing a single droplet discharge head 17 in each of the head groups 55. The X-axis linear motors 26, the pair of X-axis shared support bases 24, and the second X-axis slider 23 correspond to weight measurement unit movement means, and the Y-axis linear motors, the Y-axis sliders, and the Y-axis table 12 correspond to weight measurement unit secondary movement means.

Next, in step S25, a weight measurement discharge from all nozzles of the droplet discharge heads 17 is carried out toward the liquid receptacles 94 of a single droplet discharge head 17 facing the liquid receptacles 94 in each head group 55. The weight of the functional liquid that has landed on the liquid receptacles 94 is measured by the electron scales 99. The weight of the functional liquid landed in the liquid receptacles 94 and measured by the electron scales 99 is the discharge weight.

At this point, the five droplet discharge heads 17 that are not facing the liquid receptacles 94 in the head groups 55 are facing the weight measurement flushing boxes 95 and perform a dummy discharge toward the weight measurement flushing boxes 95, as described with reference to FIGS. 11 and 12.

Next, in step S26, the discharge weight thus measured is compared with a standard discharge weight, the error of the discharge weight is calculated, the error is compared with a specified error value, and a determination is made as to whether the error of the measured discharge weight is compatible with the specified value.

The process advances to step S27 when the error of the discharge weight is compatible with the specified value (Yes, in step S26).

After step S26, a determination is made in step S27 as to whether weight measurement has ended for all of the six droplet discharge heads 17 of the head groups 55.

When weight measurement has ended for all six droplet discharge heads 17 of the head groups 55 (Yes, in step S27), the process advances to step S28.

In step S28, drawing is carried out without performing a weight measurement. The interval of time for drawing in which weight measurement is not performed is determined by experimentation or by otherwise calculating in advance the length of time that a constant discharge state can be maintained, the number of workpieces W that can be drawn while maintaining a constant discharge state, or another parameter. In the interval of time in which the weight measurement thus established is not performed, the process advances to step S21 upon completion of step S28 and carries out steps S21 to S27 and steps S29 to S34 using as the drawing target a workpiece W that has been newly mounted on the workpiece stage 21.

When weight measurement has not been completed for all of the six droplet discharge heads 17 of the head groups 55 (No, in step S27), the process advances to step S21, and steps S21 to S27 are repeated using as the drawing target a workpiece W that has been newly mounted on the workpiece stage 21. At this point, in step S24, the liquid receptacles 94 are placed facing the droplet discharge heads 17 for which weight measurement has not been completed in the six droplet discharge heads 17 of the head groups 55. Next, steps S25 to S27 are carried out using as the measurement object the droplet discharge heads 17 facing the liquid receptacles 94.

In step S26, the process advances to step S29 when the error of the discharge weight is not compatible with the specified value (No, in step S26).

After step S26, a determination is made in step S29 as to whether the error relative to the standard value of the measured discharge weight is a prescribed value or less. The prescribed value of the error of the discharge weight is, e.g., a correctable error, is calculated in advance by adjusting the drive conditions of the droplet discharge heads 17.

The process advances to step S30 when the error relative to the standard value of the measured discharge weight in step S29 is a prescribed value or less (Yes, step S29).

In step S30, the voltage applied to the droplet discharge heads 17 being measured is adjusted in correspondence to the size of the error relative to the standard value of the measured discharge weight.

After step S30, the process advances to step S25, and steps S25 to S29 are repeated.

The process advances the step S31 when the error relative to the standard value of the measured discharge weight in step S29 has exceeded a prescribed value (No, in step S29).

In step S31, a weight measurement discharge is made from all nozzles of the droplet discharge heads 17 toward the liquid receptacles 94 from a single droplet discharge heads 17 facing the liquid receptacles 94 in the head groups 55 in the same manner as in step S25 described above. The weight of the functional liquid landed in the liquid receptacles 94 is measured by the electron scales 99.

The five droplet discharge heads 17 that are not facing the liquid receptacles 94 in the head groups 55 perform a dummy discharge toward the weight measurement flushing boxes 95.

Steps S32, S33, and S34 are subsequently carried out in the same manner as steps S26, S29, and S30.

The discharge weight may sometimes temporarily fluctuate and immediately return to an optimum state. The steps S31 to S34 are designed to verify whether the fact that the error relative to the standard value of the measured discharge weight has been determined to have exceeded a prescribed value is due to a temporary fluctuation. When the error caused by a temporary fluctuation has exceeded a prescribed value, it is possible to return to each step from step S21 by performing steps S32, S33, and S34.

The process advances to step S35 when the error relative to the standard value of the measured discharge weight in step S33 has exceeded a prescribed value (No, in step S33).

In step S35, an adjustment routine is carried out. Examples of an adjustment routine include forcible expelling of functional liquid by the suction unit 15, wiping of the nozzle formation surface 76*a* by the wiping unit 16, and other maintenance work. Alternatively, the droplet discharge heads 17 may be replaced with a new droplet discharge head when the droplet discharge heads 17 as such has degraded.

In FIG. 14, step S35 is carried out and the drawing step is ended, but when the adjustment routine involves performing maintenance work or the like by using the maintenance unit 5 provided to the droplet discharge apparatus 1, the drawing step is temporarily suspended and maintenance work or the like is carried out. When the maintenance work or the like has been completed, the drawing step is subsequently carried out. The drawing step is temporarily ended when the droplet discharge heads 17 must be replaced or another routine must be performed.

As described above, step S22 is started substantially at the same time as step S4. Step S22 and steps S23 to S34, which are performed subsequent to step S22, are carried out concurrent to steps S4, S5, S1, S2, S3 while steps S4, S5, S1, S2, S3, which correspond to the feed/removal step, are carried out.

The following effects are obtained in accordance with the present embodiment.

(1) A weight measurement discharge step (step S25), in which it is essential that the droplet discharge heads 17 perform a discharge, is carried out during the feed/removal step (steps S4, S5, S1, S2, S3) in which the droplet discharge heads 17 are not required to perform a discharge. The weight measurement discharge step is performed during the time the droplet discharge head is in a so-called resting state, whereby additional time is not required for the weight measurement discharge step. Therefore, an increase in the operating time for drawing by droplet discharge can be reduced.

(2) In the droplet discharge apparatus 1, an X-axis table 11 is provided with a first X-axis slider 22, a second X-axis slider 23, a left and right pair of X-axis linear motors 26, and a pair of X-axis shared support bases 24. A workpiece stage 21 is secured to the first X-axis slider 22, and a flushing unit 14, a test drawing unit 16,1 and a weight measurement unit 19 of a discharge test unit 18 are provided to the second X-axis slider 23. Since the workpiece stage 21, flushing unit 14, test drawing unit 161, and weight measurement unit 19 are disposed on the same trajectory, these units or the like can merely be moved along the same trajectory in order to be placed opposite the head groups 55. Accordingly, the transition time between the drawing discharge toward the workpiece W mounted on the workpiece stage 21 and the discharge test carried out by the discharge test unit 18, or the weight measurement carried out by the weight measurement unit 19, can be reduced in comparison with a case in which the movement direction is changed and the mutual relative movements of the devices are carried out when a transition is made between a drawing discharge and a discharge test or a weight measurement. For this reason, the overall tact time can be reduced because the mutual transition between the weight measurement routine, the drawing routine, and the discharge test routine can be reduced even when weight measurements and discharge tests are periodically carried out.

(3) Weight measurement flushing boxes 95 are configured with weight measurement flushing boxes 95*a* and weight measurement flushing boxes 95*b* disposed on both sides of liquid receptacles 94 in the X-axis direction. When the liquid receptacles 94 face a single droplet discharge head 17 among the six droplet discharge heads 17 of the head group 55 and perform a weight measurement discharge, the other five droplet discharge heads 17 face the weight measurement flushing boxes 95*a* or the weight measurement flushing boxes 95*b* and can perform a dummy discharge. The discharge nozzles 78 of the droplet discharge heads 17 can be prevented from drying in the standby state, and a weight measurement discharge after the standby state can be adequately performed.

(4) The discharge test block 4*a* is formed integrally with a weight measurement unit 19, a flushing unit 14, and a test drawing unit 161, and can therefore be integrally moved in the X-axis direction by the use of the second X-axis slider 23 in addition to the X-axis linear motors 26 and X-axis shared support bases 24. The moving device can be made smaller in comparison with a configuration in which the X-axis sliders are independently disposed in order to move the weight measurement unit 19, the flushing unit 14, and the test drawing unit 161 in the X-axis direction.

(5) The droplet discharge apparatus 1 positions the workpiece stage 21 in the feed/removal position in which the workpiece stage 21 does not face the droplet discharge heads 17. The weight measurement can thereby be performed during feed/removal because the weight measurement unit 19 can be placed facing the droplet discharge heads 17 while the workpiece W is being fed or removed.

(6) The weight measurement flushing boxes 95*a* and the periodic flushing boxes 93 are formed to a size in which the six droplet discharge heads 17 in the head group 55 face the weight measurement flushing boxes 95*a* or the periodic flushing boxes 93 even when the test cameras 163 are facing an arbitrary position in the X-axis direction of the test sheet 171. A dummy discharge of the six droplet discharge heads 17 in the head group 55 can be carried out at the same time as an of the droplets that have landed on the test sheet 171 is captured by the test cameras 163.

A preferred embodiment was described above with reference to the drawings. However, the preferred embodiment imposes no limitations on the embodiments. It is apparent that various modifications can be made in a range that does not depart from the main points of the invention, and the following modifications are also possible.

Modification 1

In the embodiment described above, the test drawing unit 161 having a test sheet 171 (test discharge landing sheet) is configured so as to move in the X-axis direction (main scanning direction) as a single entity together with the weight measurement unit 19 and the flushing unit 14. However, it is not essential that the test discharge landing sheet and the weight measurement unit be integrally moved in the main scanning direction. The test discharge landing sheet and the weight measurement unit may be configured to be moved independently in the main scanning direction. Such a configuration allows the weight measurement unit and the droplet discharge head to be placed facing each other when the test discharge landing sheet faces the state observation device. The device for moving the test discharge landing sheet independently in the main scanning direction corresponds to test unit movement means.

In the embodiment described above, a step for capturing an image of the droplet of functional liquid that has landed on the test sheet 171 (test discharge landing sheet) is performed by the test cameras 163 (state observation devices) of the imaging unit 162. Next, a weight measurement discharge (weight measurement discharge step) is made by the droplet discharge heads 17 toward the liquid receptacles 94 of the weight measurement unit 19. However, the weight measurement unit and the droplet discharge head can be placed facing each other in a state in which the test discharge landing sheet is facing the state observation device, and the state information acquisition step and the weight measurement discharge step can be carried out substantially concurrently by configuring the test discharge landing sheet and the weight measurement unit to be moved individually in the main scanning direction.

Modification 2

In the embodiment described above, only the droplet discharge heads 17 can move in the Y-axis direction; the discharge test block 4*a* is configured as a single entity together with the weight measurement unit 19, the flushing unit 14, and the test drawing unit 161; and the positions thereof in the Y-axis direction are mutual fixed. Also, the position of the imaging unit 162 having the test cameras 163 is fixed in the Y-axis direction. However, an Y-axis direction movement device may be provided that moves the test sheet 171 of the test drawing unit 161, the imaging unit 162, or the weight measurement unit 19 in the Y-axis direction. The Y-axis direction movement device corresponds to test unit secondary movement means.

In the embodiment described above, since only the droplet discharge heads 17 can move in the Y-axis direction, the relative movement in the Y-axis direction between the devices is achieved by movement of the droplet discharge heads 17 in the Y-axis direction. For example, when one of the six droplet discharge heads 17 in the head group 55 is placed facing the liquid receptacles 94, the position of the head group 55 in the Y-axis direction does not necessarily face a suitable position of the test sheet 171 in the test drawing unit 161. Therefore, movement of the droplet discharge heads 17 in the Y-axis direction is required for each of the device placed facing the droplet discharge heads 17. Since the test sheet 171 of the test drawing unit 161, the imaging unit 162, and the weight measurement unit 19 can be moved in relation to each other by an Y-axis direction movement device, the devices can be placed relative to each other in the Y-axis direction. It is thereby possible to reduce the number of cycles required for movement and positioning of the droplet discharge heads 17 in the Y-axis direction in order to position the droplet discharge heads 17 in relation to these devices.

Modification 3

In the embodiment described above, weight measurement is carried out for each of the droplet discharge heads 17, but it is not essential that the discharge weight be measured in units of droplet discharge heads 17. Measurement may be carried out for each nozzle row provided to the droplet discharge head, or measurement may be carried out for each nozzle.

Modification 4

In the embodiment described above, a method of adjusting the discharge amount to a suitable value by adjusting the drive voltage applied to the droplet discharge heads 17 is described as a method of correcting variations in the discharge amount, but another method of correcting variations in the discharge amount may be used. For example, the droplet discharge head for discharging droplets and causing the droplets to land in positions adjacent to positions in which discharge droplets have landed from a droplet discharge head not adjusted to the correct discharge amount may be compensated for by performing an adjustment so as to achieve a suitable discharge amount in conformity with the droplet discharge head having the unsuitable discharge amount.

Modification 5

In the embodiment described above, the discharge test is carried out one time for each time the workpiece W is replaced, but it is not essential that the discharge test be performed at each replacement of the workpiece W. For example, the discharge test may be carried out one time within a single cycle of weight measurement is performed for all the droplet discharge heads in a head group.

Modification 6

In the embodiment described above, the weight measurement related to the six droplet discharge heads 17 in the head group 55 is carried out during six continuous feed/removal steps, but it is not essential that the weight measurement related to the droplet discharge heads 17 be carried out each time the feed/removal step is performed. For example, the feed/removal step may be carried out differently than as a weight measurement carried out during a feed/removal step accompanied by a series of weight measurements, i.e., a single weight measurement may be performed for every two feed/removal steps.

Modification 7

In the embodiment described above, the state information acquisition step of the discharge test step is carried out during the feed/removal step, but it is not essential that the state information acquisition step of the discharge test step be carried out during the feed/removal step. It is possible to perform only a test discharge by using the droplet discharge head during the feed/removal step, and to perform drawing discharges or the like concurrent to the state information acquisition step.

Modification 8

In the embodiment described above, the CPU 44 of the discharge apparatus controller 6 acting as a receptacle management unit computes the weight of the measured functional liquid, stores the result in the RAM 46, and issues information about the instructions to replace the liquid receptacles 94 (weight measurement receptacle) when the cumulative weight reaches a fixed amount. However, it is not essential that the weight of the functional liquid measured by the receptacle management unit be computed and the information about the instructions to replace the weight measurement receptacle be issued. The receptacle management unit may compute the number of times the droplet discharge head has made a weight measurement discharge, store the result, and issue information about the instructions to replace the weight measurement receptacle when the number of discharges has reached a fixed amount. The number of discharges per single cycle of weight measurement discharges is fixed, and the number of weight measurement discharges is the number of times a weight measurement discharge command has been issued. Since the computation is simple and the total number of discharges can be easily computed and stored, the information routine in the receptacle management unit can be reduced in accordance with a case in which measured weights are computed.

Modification 9

In the embodiment described above, in the time the droplet discharge heads 17 are performing weight measurement discharges, the other droplet discharge heads 17 in the head group 55 to which the droplet discharge heads 17 belong perform a dummy discharge. However, it is not essential that the droplet discharge heads 17 perform a dummy discharge while the droplet discharge heads 17 are carrying out a weight measurement discharge. If there is substantially no possibility that the discharge nozzles in the other droplet discharge heads 17 will dry or otherwise malfunction, the other droplet discharge heads 17 may be simply paused while a single droplet discharge head 17 performs a weight measurement discharge.

Modification 10

In the embodiment described above, a single droplet discharge head 17 performs a weight measurement discharge during the time of a single feed/removal cycle, and the weight of the droplet discharged by the single droplet discharge head 17 is measured, but it is not essential that the weight measurement be performed for only the single droplet discharge head 17 during a single feed/removal cycle. Weight measurement may be performed for a plurality of droplet discharge heads as long as the weight measurement can be performed for a plurality of droplet discharge heads during a single feed/removal cycle.

Modification 11

In the embodiment described above, an interval for drawing without performing a weight measurement is provided for all six of the droplet discharge heads 17 of the head groups 55 each time the weight measurement is ended, but it is not essential that a drawing interval be provided without performing a weight measurement. A weight measurement may be performed each time the workpiece W is replaced.

Modification 12

In the embodiment described above, a weight measurement was repeated in order to verify the measurement results when an error relative to a standard value of the measured discharge weight had exceeded a prescribed value. However, it is not essential that the measurement results be verified via a weight measurement. A discharge test or the like using the discharge test unit 18 may be used to verify measurement results.

Modification 13

In the embodiment described above, the relative movement of the droplet discharge heads 17 and the workpiece stage 21 in the X-axis direction was carried out by moving the workpiece stage 21 in the X-axis direction. The relative movement of the droplet discharge heads 17, the test drawing unit 161, the weight measurement unit 19, or the flushing unit 14 in the X-axis direction was carried out by moving the discharge test block 4*a* composed of the test drawing unit 161, the weight measurement unit 19, and the flushing unit 14 in the X-axis direction. The relative movement of the imaging unit 162 and the test drawing unit 161 in the X-axis direction was carried out by moving the test drawing unit 161 in the X-axis direction. However, it is not essential that the relative movement of these components in the X-axis direction be carried out by moving the workpiece stage 21 or the discharge test block 4*a* in the X-axis direction. The configuration may be one in which the above-described relative movements in the X-axis direction be carried out by moving the droplet discharge heads 17 or the imaging unit 162 in the X-axis direction.

Also, in the embodiment described above, the movement of the droplet discharge heads 17, the workpiece stage 21, the test drawing unit 161, the weight measurement unit 19, or the flushing unit 14 in the Y-axis direction was carried out by moving the discharge unit 2 having the droplet discharge heads 17 in the Y-axis direction. A configuration is also possible in which the relative movement is carried out by moving the discharge test block 4*a* in the Y-axis direction.

A configuration is further possible in which the relative movements in the X-axis direction and Y-axis direction are carried out by moving the workpiece stage 21, the discharge test block 4*a*, the droplet discharge heads 17, and the imaging unit 162 in the X- and Y-axis directions.

Modification 14

In the embodiment described above, step S22 was started substantially at the same time as step S4, and step S22 and the subsequent steps S23 to S34 were performed concurrent to steps S4, S5, S1, S2, S3 while steps S4, S5, S1, S2, S3, which correspond to the feed/removal step, were performed. However, time is required for performing steps S22 to S28 as well as for performing steps S29 to S34 or steps S31 to S34 when performing steps S29 to S34, which are carried out when the error relative to the standard value of the measured discharge weight has exceeded a prescribed value, or steps S31 to S34, which are performed for verification purposes. Drawing discharges may be temporarily stopped when there is a need for steps S29 to S34 or steps S31 to S34 to be performed in a case in which the total time has exceed the time allocated to the feed/removal step.

General Interpretation of Terms

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A droplet discharge apparatus comprising:

a set of a plurality of droplet discharge heads configured and arranged to discharge a liquid material;

a stage configured and arranged to mount a substrate as a target of landing the discharged liquid material;

a stage movement unit configured and arranged to move the droplet discharge heads and the stage relative to each other in a main scanning direction;

a weight measurement unit configured and arranged to measure the weight of the liquid material discharged from the droplet discharge heads;

a weight measurement unit movement part configured and arranged to move the droplet discharge heads and the weight measurement unit relative to each other in the main scanning direction;

a weight measurement unit secondary movement part configured and arranged to move the droplet discharge heads and the weight measurement unit relative to each other in a secondary scanning direction that is substantially orthogonal to the main scanning direction;

a dummy discharge receptacle configured and arranged to receive the liquid material discharged in a dummy discharge performed by the droplet discharge heads in order to maintain a state of the droplet discharge heads; and a weight measurement controller configured to control the droplet discharge heads, the weight measurement unit, the weight measurement unit movement part, and the weight measurement unit secondary movement part, the weight measurement controller being configured to move the droplet discharge heads and the weight measurement unit relative to each other so that the droplet discharge heads are placed in a position that faces the weight measurement unit by controlling the weight measurement unit movement part and the weight measurement unit secondary movement part, the weight measurement controller being configured to control one of the droplet discharge heads in the set to perform a weight measurement discharge for measuring a weight of the liquid material discharged from the one of the droplet discharge heads, and to control the rest of the droplet discharge heads in the set so that the dummy discharge is performed in the rest of the droplet discharge heads concurrent to the weight measurement discharge carried out by the one of the droplet discharge heads.

2. The droplet discharge apparatus according to claim 1, further comprising a discharge test device having a test discharge landing sheet on which is caused to land the liquid material discharged in the test discharge performed by the droplet discharge heads in order to test a discharge state of the droplet discharge heads, the discharge test device further including a state observation device configured and arranged to acquire state information of the liquid material that has landed on the test discharge landing sheet, and a discharge test controller configured to control the droplet discharge heads and the state observation device, the weight measurement unit movement part being configured and arranged to move the droplet discharge heads, the discharge receptacle, and the test discharge landing sheet relative to each other in the main scanning direction, the weight measurement unit secondary movement part being configured and arranged to move the droplet discharge heads, the discharge receptacle, and the test discharge landing sheet relative to each other in the secondary scanning direction;

the weight measurement controller being configured to control the weight measurement unit movement part and the weight measurement unit secondary movement part, whereby the droplet discharge heads, the discharge receptacle, and the test discharge landing sheet are moved relative to each other so that the droplet discharge heads are placed in a position that faces the dummy discharge receptacle or the test discharge landing sheet, the controller being further configured to control the weight measurement unit movement part and the weight measurement unit secondary movement part, whereby the state observation device and the test discharge landing sheet are moved relative to each other so that the state observation device is placed in a position that faces the test discharge landing sheet, and the discharge test controller being also configured to control the state observation device so as to acquire the state information of the liquid material that has landed on the test discharge landing sheet faced by the state observation device.

3. The droplet discharge apparatus according to claim 2, wherein the discharge test controller and the weight measurement controller are configured to control the state observation device and the droplet discharge heads so that the acquisition of the state information by the state observation device and the discharge of the weight measurement discharge by the droplet discharge heads are carried out at mutually offset timings.

4. The droplet discharge apparatus according to claim 2, wherein the test discharge landing sheet is configured and arranged to move with respect to the droplet discharge heads or the state observation device, the discharge test controller being configured to to move the droplet discharge heads and the test discharge landing sheet relative to each other so that the droplet discharge heads are placed in a position that faces the test discharge landing sheet, and to move the state observation device and the test discharge landing sheet relative to each other so that the state observation device is placed in a position that faces the test discharge landing sheet, the discharge test controller and the weight measurement controller being configured to control the state observation device and the droplet discharge heads so that the acquisition of the state information by the state observation device and the discharge of the weight measurement discharge by the droplet discharge heads are substantially concurrently performed.

5. The droplet discharge apparatus according to claim 4, further comprising the test discharge landing sheet is configured and arranged to move with respect to the droplet discharge heads or the state observation device, and the test discharge landing sheet relative to each other in the secondary scanning direction, the discharge test controller being configured to move the droplet discharge heads and the test discharge landing sheet relative to each other so that the droplet discharge heads are placed in a position that faces the dummy discharge receptacle or the test discharge landing sheet, and to move the state observation device and the test discharge landing sheet relative to each other so that the state observation device is placed in a position that faces the test discharge landing sheet.

6. The droplet discharge apparatus according to claim 1, wherein a confirmation test is carried out in a case in which a difference, as determined with respect to a reference value, of a measured value in which the weight of the liquid material discharged for weight measurement from the droplet discharge heads is measured by the weight measurement unit has exceeded a prescribed value.

7. The droplet discharge apparatus according to claim 6, wherein the confirmation test is the weight measurement carried out by the weight measurement unit.

8. The droplet discharge apparatus according to claim 6, wherein the confirmation test is the test of the discharge state of the droplet discharge heads carried out by the discharge test device.

9. The droplet discharge apparatus according to claim 1, further comprising a discharge condition setting unit configured to set discharge conditions of the droplet discharge heads, the discharge condition setting unit being configured to correct the discharge conditions in the droplet discharge heads when a difference in the measured value, in which the weight of the liquid material discharged for the weight measurement from the droplet discharge heads is measured by the weight measurement unit, in relation to a reference value has exceeded a first value and is equal to or less than a second value.

10. The droplet discharge apparatus according to claim 9, wherein one of the discharge conditions is a drive voltage applied to the droplet discharge heads, and the correction includes correction of a drive voltage value or a drive voltage waveform.

11. The droplet discharge apparatus according to claim 1, wherein the weight measurement discharge carried out by one of the droplet discharge heads is performed during a single cycle of a feed/removal period, the feed/removal period including a period for feeding a to-be-treated substrate and removing a treated substrate from the stage, and a period in which the stage is moved in relative fashion by the stage movement unit for performing feeding and removal operations.

12. The droplet discharge apparatus according to claim 11, wherein a head assembly containing a plurality of the droplet discharge heads is specified in advance, the weight measurement controller being configured to control the weight measurement unit movement part and the droplet discharge heads so that each of the droplet discharge heads included in the head assembly sequentially performs a single cycle of the weight measurement discharge and to weigh the liquid material discharged by the droplet discharge heads in conjunction with a plurality of cycles of the feed/removal being performed, the weight measurement controller being further configured to control the weight measurement unit movement part and the droplet discharge heads so that the feed/removal is performed a plurality of cycles without being accompanied by the concurrent discharge of the weight measurement, the feed/removal that accompanies the concurrent discharge of the weight measurement discharge of the first droplet discharge head, and the subsequent feed/removal that accompanies the concurrent discharge of the weight measurement discharge of the first droplet discharge head.

13. The droplet discharge apparatus according to claim 1, further comprising a weight measurement receptacle configured and arranged to accommodate the liquid material discharged by the weight measurement discharge, and a receptacle management unit configured to calculate the period in which the weight measurement receptacle is to be replaced, and to issue replacement instruction information, the receptacle management unit being configured to calculate the replacement period depending on the discharge state of the weight measurement discharge.

14. The droplet discharge apparatus according to claim 13, wherein the receptacle management unit is configured to count a total number of the weight measurement discharges, and to set the replacement period to a point in time at which the total number of discharges has exceeded a prescribed numerical value.

15. The droplet discharge apparatus according to claim 13, wherein the receptacle management unit is configured to calculate a total weight of the liquid material measured in the weight measurement, and to set the replacement period to a point in time at which the total weight has exceeded a prescribed numerical value.

* * * * *